(12) United States Patent
Kolbow et al.

(10) Patent No.: US 9,745,119 B2
(45) Date of Patent: Aug. 29, 2017

(54) RETICLE POD

(71) Applicant: Entegris, Inc., Billerica, MN (US)

(72) Inventors: Steven P. Kolbow, Chaska, MN (US);
Kevin McMullen, Shorewood, MN (US); Anthony M. Tieben, Jordan, MN (US); Matthew Kusz, Minneapolis, MN (US); David L. Halbmaier, Shorewood, MN (US); John Lystad, Bloomington, MN (US)

(73) Assignee: Entegris, Inc., Billerica, MA (US)

( * ) Notice: Subject to any disclaimer, the term of this patent is extended or adjusted under 35 U.S.C. 154(b) by 390 days.

(21) Appl. No.: 14/139,653

(22) Filed: Dec. 23, 2013

(65) Prior Publication Data
US 2014/0183076 A1    Jul. 3, 2014

Related U.S. Application Data

(63) Continuation of application No. 13/562,087, filed on Jul. 30, 2012, now Pat. No. 8,613,359, which is a
(Continued)

(51) Int. Cl.
| | | |
|---|---|---|
| *B65D 85/48* | (2006.01) | |
| *G03F 1/66* | (2012.01) | |
| *H01L 21/673* | (2006.01) | |

(52) U.S. Cl.
CPC .............. *B65D 85/48* (2013.01); *G03F 1/66* (2013.01); *H01L 21/67353* (2013.01);
(Continued)

(58) Field of Classification Search
CPC ..... G03F 1/62; G03F 1/64; G03F 1/66; H01L 21/67353; H01L 21/67359
(Continued)

(56) References Cited

U.S. PATENT DOCUMENTS 3,615,006 A * 10/1971 Freed .................. G03F 7/70741
                                                    206/454
4,422,547 A * 12/1983 Abe .......................... G03F 1/66
                                                    206/454
(Continued)

FOREIGN PATENT DOCUMENTS

JP        05-175321 A      7/1993
JP      2003-045773 A      2/2003
(Continued)

*Primary Examiner* — Anthony Stashick
*Assistant Examiner* — Ernesto Grano
(74) *Attorney, Agent, or Firm* — Entegris, Inc. Legal Dept.; Catherine D. Gates

(57) ABSTRACT

A dual containment pod having an outer pod and an inner pod that provides support structure and environmental control means. The inner pod includes a base having a flat, polished surface with protrusions upon which the reticle seats and providing a gap between the reticle and the polished surface. The gap separates the reticle from the flat, polished surface of the base and is dimensioned to inhibit migration of particles into the gap, thereby preventing contamination of sensitive surfaces of the wafer or reticle. The top cover of the inner pod seats on the polished surface proximate a periphery of the base. Moveable reticle engaging pins on the top cover of the inner pod are engaged by the top cover of the outer container when the inner pod is assembled inside the outer pod providing reticle restraint.

11 Claims, 14 Drawing Sheets

Related U.S. Application Data continuation of application No. 12/088,120, filed as application No. PCT/US2006/037465 on Sep. 27, 2006, now Pat. No. 8,231,005.

(60) Provisional application No. 60/774,391, filed on Feb. 18, 2006, provisional application No. 60/774,537, filed on Feb. 18, 2006, provisional application No. 60/720,777, filed on Sep. 27, 2005, provisional application No. 60/720,762, filed on Sep. 27, 2005, provisional application No. 60/720,778, filed on Sep. 27, 2005.

(52) U.S. Cl.
CPC .. *H01L 21/67359* (2013.01); *H01L 21/67383* (2013.01); *H01L 21/67386* (2013.01)

(58) Field of Classification Search
USPC .......................................................... 206/454
See application file for complete search history.

(56) References Cited

U.S. PATENT DOCUMENTS

| | | | |
|---|---|---|---|
| 4,776,462 A * | 10/1988 | Kosugi | G03F 1/66 206/449 |
| 4,830,182 A * | 5/1989 | Nakazato | B65D 53/02 206/454 |
| 4,842,136 A * | 6/1989 | Nakazato | G03F 1/66 16/48.5 |
| 5,024,329 A * | 6/1991 | Grohrock | H01L 21/67376 141/98 |
| 5,296,893 A | 3/1994 | Shaw et al. | |
| 5,314,068 A | 5/1994 | Nakazato et al. | |
| 5,320,225 A * | 6/1994 | Kirkpatrick | G03F 1/66 206/449 |
| 5,353,934 A * | 10/1994 | Yamauchi | G03F 1/66 206/453 |
| 5,474,177 A | 12/1995 | Abrams et al. | |
| 5,593,040 A * | 1/1997 | Shelton | B23K 3/087 108/55.3 |
| 5,695,068 A * | 12/1997 | Hart | B65D 85/38 206/486 |
| 5,743,409 A * | 4/1998 | Nakahara | G03F 1/66 206/454 |
| 6,105,782 A | 8/2000 | Fujimori et al. | |
| 6,196,391 B1 | 3/2001 | Li | |
| 6,216,873 B1 | 4/2001 | Fosnight et al. | |
| 6,247,599 B1 | 6/2001 | Cheng et al. | |
| 6,315,124 B1 | 11/2001 | Hirohata et al. | |
| 6,421,113 B1 | 7/2002 | Armentrout | |
| 6,682,295 B2 | 1/2004 | Blank et al. | |
| 6,862,817 B1 | 3/2005 | Lenox | |
| 6,900,878 B2 | 5/2005 | Okubo et al. | |
| 6,906,783 B2 | 6/2005 | del Pureto et al. | |
| 6,915,906 B2 | 7/2005 | Pylant | |
| 6,948,619 B2 * | 9/2005 | Su | G03F 1/66 206/454 |
| 7,009,689 B2 * | 3/2006 | Chiu | G03F 1/66 206/454 |
| 7,139,066 B2 | 11/2006 | Wiseman et al. | |
| 7,258,520 B2 * | 8/2007 | Elliott | H01L 21/67353 414/217 |
| 7,309,460 B2 * | 12/2007 | Johnson | G03F 1/66 264/138 |
| 7,400,383 B2 | 7/2008 | Halbmaier et al. | |
| 7,477,358 B2 | 1/2009 | Phillips et al. | |
| 7,581,372 B2 * | 9/2009 | Durben | G03F 1/66 53/281 |
| 7,607,543 B2 | 10/2009 | Gregerson et al. | |
| 7,804,583 B2 | 9/2010 | Phillips et al. | |
| 7,850,009 B2 * | 12/2010 | Wu | G03F 1/66 206/454 |
| 8,146,623 B2 | 4/2012 | Tieben et al. | |
| 8,231,005 B2 | 7/2012 | Kolbow et al. | |
| 2003/0218728 A1 | 11/2003 | del Puerto et al. | |
| 2003/0227605 A1 | 12/2003 | del Puerto et al. | |

FOREIGN PATENT DOCUMENTS

| | | |
|---|---|---|
| JP | 2004-356478 A | 12/2004 |
| KR | 10-2005-0025310 A | 3/2005 |
| TW | 416091 | 12/2000 |

\* cited by examiner

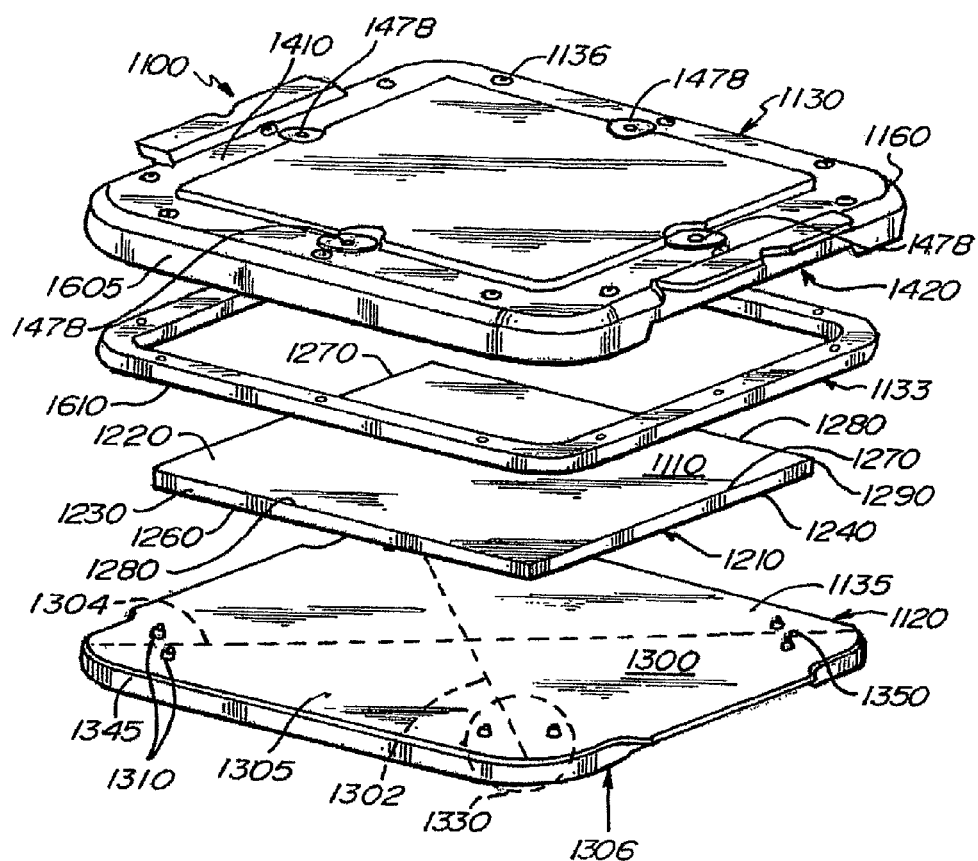
Fig. 19.
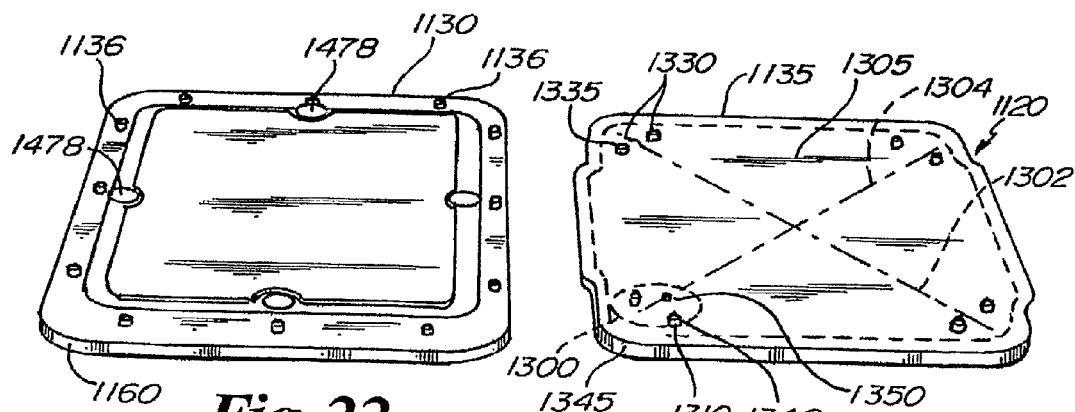
Fig. 22.
Fig. 23.

RETICLE POD

REFERENCES TO RELATED APPLICATIONS

This is a request for filing a Continuation application, under 37 CFR §1.53(b), of pending prior application Ser. No. 13/562,087, filed Jul. 30, 2012 (U.S. Pat. No. 8,612,359 issuing Dec. 24, 2013) which was a Continuation application, under 37 CFR §1.53(b), of prior application Ser. No. 12/088,120, filed Sep. 11, 2008 (U.S. Pat. No. 8,231,005 issued Jul. 31, 2012) for: RETICLE POD by: Steven Kolbow et al. The entire disclosure of the prior applications and are considered as being part of the disclosure of the accompanying application and is hereby incorporated by reference herein.

This application claims priority to application Ser. No. 13/562,087, filed Jul. 30, 2012 (issuing as U.S. Pat. No. 8,612,359 on Dec. 24, 2013), which claims priority to application Ser. No. 12/088,120, filed Sep. 11, 2008, now U.S. Pat. No. 8,231,005 issued Jul. 31, 2012; which also claims priority to the following U.S. provisional applications: U.S. Application No. 60/720,762, filed 27 Sep. 2005; U.S. Application No. 60/720,777, filed 27 Sep. 2005; U.S. Application No. 60/720,778, filed 27 Sep. 2005; U.S. Application No. 60/774,391, filed 18 Feb. 2006; and U.S. Application No. 60/774,537, filed 18 Feb. 2006. The entirety of all of the aforementioned applications are hereby incorporated by reference herein.

FIELD OF THE INVENTION

This invention relates to container for storage, transport, shipping and processing of fragile devices such as photomasks, reticles and wafers, and, in particular, this invention relates to protection means, particularly particle control means including support structures for locating and securing a reticle with means for maintaining a clean environment for the reticle.

BACKGROUND OF THE INVENTION

One of the process steps commonly encountered in the fabrication of integrated circuits and other semiconductor devices is photolithography. Broadly, photolithography involves selectively exposing a specially prepared wafer surface to a source of radiation using a patterned template to create an etched surface layer. Typically, the patterned template is a reticle, which is a very flat glass plate that contains the patterns to be reproduced on the wafer. For example, the wafer surface may be prepared by first depositing silicon nitride on it followed by a coating of a light-sensitive liquid polymer or photoresist. Next, ultraviolet (UV) light is shone through or reflected off a surface of a mask or reticle to project the desired pattern onto the photoresist-covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is then subjected to an etch process that removes the exposed portion of the nitride layer leaving a nitride pattern on the wafer in the exact design of the mask. This etched layer, singly or in combination with other similarly created layers, represent the devices and interconnects between devices characterizing the "circuitry" of a particular integrated circuit or semiconductor chip.

The industry trend is towards the production of chips that are smaller and/or with a higher logic density necessitating even smaller line widths on larger wafers. Clearly, the degree of fineness to which the surface of the reticle can be patterned and the degree to which this pattern can be faithfully replicated onto the wafer surface are factors that impact the quality of the ultimate semiconductor product. The resolution with which the pattern can be reproduced on the wafer surface depends on the wavelength of ultraviolet light used to project the pattern onto the surface of the photoresist-coated wafer. State-of-the-art photolithography tools use deep ultraviolet light with wavelengths of 193 nm, which allow minimum feature sizes on the order of 100 nm. Tools currently being developed use 157 nm Extreme Ultraviolet (EUV) light to permit resolution of features at sizes below 70 nm. The reticle is a very flat glass plate that contains the patterns to be reproduced on the wafer.

Typical reticle substrate material is optically clear quartz. Because of the tiny size of the critical elements of modern integrated circuits, it is essential that the operative surface of the reticle (i.e. the patterned surface) be kept free of contaminants that could either damage the surface or distort the image projected onto the photoresist layer during processing leading to a final product of unacceptable quality. Typically, the critical particle sizes are 0.1 .mu.m and 0.03 .mu.m for the non-patterned and patterned surfaces respectively when EUV is part of the photolithography process.

Typically, the patterned surface of the reticle is coated with a thin, optically transparent film, typically of nitrocellulose, attached to and supported by a frame, and attached to the reticle. Its purpose is to seal out contaminants and reduce printed defects potentially caused by such contamination in the image plane. With EUV, however, reflection from the patterned surface is used as opposed to transmission through the reticle characteristic of deep ultraviolet light photolithography. At his time, the art does not provide pellicle materials that are transparent to EUV. Consequently, the reflective photomask (reticle) employed in EUV photolithography is susceptible to contamination and damage to a far greater degree than reticles used in conventional photolithography. This situation imposes heightened functional requirements on a container or pod designed to store, transport and ship a reticle destined for EUV photolithography use. Generally, reticles are stored and/or transported within a mini-clean room type environment created within a SMIF container or pod. Such a container typically includes a door and a cover that mates with the door to form a hermetically sealed enclosure for holding the reticle. The door is generally designed and equipped with special features and mechanisms to enable interfacing with a process tool for automatic or manual opening of the door and subsequent transfer of the reticle to the process tool environment without exposing the reticle to the ambient atmosphere.

Considering the severe impact of particulates on semiconductor fabrication, unnecessary and unintended contact between the reticle and other surfaces during manufacturing, processing, shipping, handling, transport or storage is highly undesirable in view of the susceptibility of the reticle to damage to the delicate features on the patterned surface due to sliding friction and abrasion. Secondly, any particulate contamination of the surface of the reticle could compromise the reticle to a degree sufficient to seriously affect any end product obtained from the use of such a reticle during processing. Particles can be generated within the controlled environment containing the reticle during processing, transport and shipping. Sliding friction between the reticle and the container and consequent abrasion is one of the sources of contaminating particulates. Such a situation can arise while trying to position the reticle inside the container or due to relative movement between the reticle and the container during transport or shipping. For example, a reticle can slide from its position within a reticle container during transport thereby generating particulates. Deformation of the walls of the container can be sufficient to introduce a shift in the position of the reticle within the container. Such a mispositioned reticle will also likely be misaligned when automatically retrieved from the container and positioned into processing equipment leading to an end product of unpredictable quality. Shock and vibration of the container can be transmitted to the reticle and components holding the reticle causing relative movement and associated particle generation. There is also the possibility that the reticle or pellicle might be scratched or crack under such conditions. Of course, the source of particulates can be airborne particulates settling on the reticle. Typically, this problem is mitigated by utilizing hermetically sealed SMIF containers to create and maintain a controlled environment around the reticle.

This discussion is equally applicable to containers designed to transport and/or store semiconductor wafer substrates and reticles that are destined for non-EUV related semiconductor fabrication. For example FOUPS (acronym for front opening unified pod) and FOSBS (acronym for front opening shipping box), and SMIF (acronym for sealed mechanical interface).

Recognizing the need for a controlled environment around the wafer, particularly during storage, processing and transport, prior art has evolved approaches to securely hold a reticle in a fixed position within the reticle container during operations involved in the storage, shipment and transport of the reticle. The most common approach involves providing supports, on a bottom surface or door of the pod, that contact the reticle patterned surface and hold it in a substantially planar configuration with respect to a surface of the container. Very often, the holding supports are augmented with one or more pressing members, extending from the cover or shell of the pod, that contact the reticle on a surface opposite the patterned surface. While this arrangement may serve to restrain movement of the reticle perpendicular to the patterned surface, it is ineffective to hold the reticle against translational movement in the plane of the patterned surface. In this regard, the prior art discloses limiting structures disposed along the periphery of the reticle all being effective to limit the lateral motion of the reticle. The prior art attempts to securely hold the reticle in the container also extend to providing a latch in combination with all of the above structural members. The latch is designed to hold the cover firmly pressed shut against the door or base thereby causing the pressing members to firmly bear down against the reticle. The pressing members may be made of resilient material or mounted at the end of cantilevered arms extending from the cover so that the pressing members can make contact and press against the reticle surface progressively as the cover is brought into engagement with the door. The cantilevered arrangement is purported to allow the application of a compliant and controlled force to the reticle by the reticle supports. Such a compliant and controlled force is said to firmly secure the reticle within the container without excessive forces on or deformation of the reticle, even under circumstances where the container may be slightly deformed. It will become readily apparent to one of ordinary skill in the art that these structures will not prevent relative sliding between the reticle and the support members, the limiting structures and the pressing members. This is particularly true where the container is likely to be subjected to shock and vibration loading. Sliding causes abrasion of the reticle surface and generates particulates.

In recognition of this problem, prior art containers include posts, mounted to the door of the container, for supporting the four respective corners of a reticle. Each corner of the post includes beveled concavities having sloped surfaces at right angles to each other. When a reticle is lowered into the reticle supports, there will be a single horizontal plane where the edge of the reticle lies in contact with each sloped surface of the beveled concavities. The reticle will quickly, easily and repeatably locate in this "single solution" position as a result of the weight of the reticle and low friction between the reticle edges and surfaces of the beveled concavities. The sloped surfaces of each beveled concavity is brought into engagement with a chamfer around a lower edge of the reticle so that the reticle is securely supported at its four corners without the reticle support coming into contact with an upper or lower surface of the reticle, or vertical edges of the reticle. The pressing members may include beveled concavities inverted with respect to the beveled concavities on the reticle supports so that once a reticle is located in the reticle supports, coupling the container cover with the container door will cause the sloped surfaces of each beveled concavity to engage a chamfer around an upper edge of the reticle so that the reticle is sandwiched between the reticle support and pressing members at its four corners so that the reticle is held securely in position during transport of the container and/or a shock to the container.

Some SMIF containers include posts, mounted to the door or base of the container, for supporting the four respective corners of a reticle. Each corner of the post may include beveled concavities having sloped surfaces at right angles to each other. When a reticle is lowered into the reticle supports, there will be a single horizontal plane where the edge of the reticle lies in contact with each sloped surface of the beveled concavities. The reticle will quickly, easily and repeatably locate in this "single solution" position as a result of the weight of the reticle and low friction between the reticle edges and surfaces of the beveled concavities. The sloped surfaces of each beveled concavity is brought into engagement with a chamfer around a lower edge of the reticle so that the reticle is securely supported at its four corners without the reticle support coming into contact with an upper or lower surface of the reticle, or vertical edges of the reticle. The pressing members may include beveled concavities inverted with respect to the beveled concavities on the reticle supports so that once a reticle is located in the reticle supports, coupling the container cover with the container door will cause the sloped surfaces of each beveled concavity to engage a chamfer around an upper edge of the reticle so that the reticle is sandwiched between the reticle support and pressing members at its four corners so that the reticle is held securely in position during transport of the container and/or a shock to the container.

The SMIF containers of the prior art do not minimize contact with the reticle as a whole. In effect, the support arrangements permit substantial sliding contact between the reticle support structures and the reticle before the reticle is brought into position within the container. All such contact may generate particulates and/or affect the pattern etched in the reticle. Additionally, prior art attempts to securely support the reticle in a fixed position within the container introduce additional contacts with the reticle that are likely to cause additional scraping and abrasion of the reticle as it is brought into and out of engagement with the restraints as the reticle is placed in and removed from the container.

The problem of particle generation within the microenvironment is exacerbated when the container is used to ship the reticle. Such a container will encounter diverse operational conditions. One of the operational hazards is that the container will be subjected to shock and vibration loading tending to dislodge the reticle from its secured position within the container. The container could also deform under the impact thereby causing the internal structures attached to the reticle to move and thereby causing the reticle to be misaligned within the container, hi this regard, isolation of the container from shock, as opposed to isolation of the reticle from the container, is an important consideration.

Particle settling is another problem to be considered. It is desirable that particulates that are generated or are otherwise introduced within the controlled environment cannot easily settle on the reticle. In this regard, it is preferable not only to have a minimal volume for the environment within which the reticle is carried and which has to be controlled to avoid particulate contamination but it is also desirable that the air in the controlled volume remain relatively static. Sudden pressure changes or large pressure changes can cause a sudden evacuation or injection of air into the controlled volume leading to turbulence. A filter surface or a wall of the container deflecting in response to large and sudden pressure differences can cause a pressure wave inside the controlled volume leading to particulate migration.

Another challenge to be overcome is the fact that even with a controlled environment, migration of particulates that may be present inside the controlled environment is still possible due to pressure changes of the air trapped in the controlled environment or turbulence of the trapped air brought on by rapid movements of the container or by disturbing the trapped air volume. For example, thin walled SMIF pods may experience wall movement due to altitude related pressure changes causing the trapped air inside the controlled environment to be displaced. Temperature changes can set up convection currents within the container. Dimensional changes of the container and its components can compromise the functioning of support and retaining mechanisms leading to wafer misalignment or warping of the substrate carried within the container. Dimensional changes of the container wall due to pressure fluctuations can lead to compromising the sealing between cover and door of the carrier and incursion of particulates within the carrier. Prior art approaches contemplate a breathing apparatus between the external environment and the internal controlled volume of air. The breathing apparatus provides a path for the air to flow. A filter interposed in the path is expected to provide a barrier to incursion of particulates from the external environment into the controlled environment of the carrier. However, as noted above, the reticle used in a EUV photolithography process has very fine and delicate features so the critical particle sizes are only of the order of 0.1 [mu]m and 0.03 [mu]m for the non-patterned and patterned surfaces of the reticle respectively. At such low particle sizes, a filter would require a very fine pore size causing a considerable resistance to fluid flow across it thereby necessitating a larger filter surface area. The alternative to a larger filter surface area is a slower response to sudden pressure changes such as those encountered in shipping the container. Both of these are not preferred alternatives because one of the objectives of reticle SMIF pod design is to keep the controlled volume to a minimal so it can be effectively sealed against incursion of particulates. Minimizing the controlled volume within which the reticle is positioned whilst providing for a large filter area to achieve pressure equalization within the controlled volume are inconsistent objectives.

Typically, prior art controlled environment is created by interposing a seal between the door and cover. However, very often the seal is made of an elastomeric material which, can be in and of itself a source of particulates or contamination. Moreover, the prior art attempts to create a seal using elastomeric seals requires structures, such as grooves and raised tabs for example, which may provide a path for the particulates to enter the inner controlled environment.

Notwithstanding their widespread use, it is generally accepted in the art that such structures present interstices which are not easy to clean when cleaning the pod thereby potentially retaining chemicals and particulates from the runoff cleaning solution.

What is needed is a reticle containment system that provides maximum protection for the reticle from particles and contamination by providing stable and secure support and a controlled environment. This should include a reticle pressure equalization system that effectively equalizes pressure between an internal controlled environment of the carrier and the air external to the carrier without incursion or excursion of air from the controlled environment and with minimal turbulence of the air already present within the controlled environment. What is also needed is a sealing system that does not utilize any form of a particulate generating material.

SUMMARY OF THE INVENTION

A reticle pod having a base or door cooperating with a cover to form an enclosure for containing a reticle is disclosed. The pod having reticle protection means including reticle positioning and support means and environmental control means. The reticle positioning and support means facilitating and forming part of the environmental control means.

In one embodiment, the subject reticle is generally rectangular, may have a patterned surface, and is positioned on a support structure mounted to a base or the door of the pod utilizing a plurality of positioning spherical balls or defining the position of the reticle on the base or door. The reticle can be positioned to a seating position by spherical balls or bevel surfaces located proximate the corners of the pod base or door and configured to position the reticle by tangentially contacting the reticle edges proximate the corners of the reticle. Locating the reticle with minimal contact area serves to reduce internal particle generation. Embodiments of the invention may also include reticle retainers mounted to the cover. The retainers may be spherical balls, which contact the reticle surface at a point. In other embodiments, the tangential point contact at the corners may be made by structures other than the spherical balls.

According to an embodiment of the invention, the reticle is located and secured within the SMIF reticle pod container by securing the reticle between two sets of projections that impart a rounded point contact on the reticle. In one embodiment, the projections may comprise spherical balls. The first set of spherical ball projections is provided on the base and contacts one surface of the reticle, usually the patterned surface. The second set of spherical ball projections is mounted to the cover of the pod and generally contacts the non-patterned or chucking surface of the reticle. Supporting and retaining the reticle in this manner minimizes contact between the reticle and the pod and allows flexibility of contact material. The spherical balls mounted on the door and upon which the reticle rests, are sized to provide a thin gap between the reticle patterned surface and the surface of the door. A preferred material for the spheres is polyamide-imide. The components are fabricated to tolerances that preclude contact between the reticle and the interior surface of the door, yet provides a gap that is narrow enough to present a diffusion barrier that prevents particle migration into the gap and onto the critical area of the reticle. The pod is shaped to minimize internal volume thereby reducing the amount of air needed to be transferred during pressure equalization.

In another embodiment of the invention, a dual containment pod comprises a first or inner pod, also known as a cassette, that is contained in a second or outer pod or package, known as a reticle SMEF pod. The base and top cover of the inner pod may mate together at cooperating flat surfaces to provide sealing. Such surfaces may be polished or ultra planar metal surfaces. The base may be formed primarily or exclusively of metal with the cover having a ring metal insert attached therein for providing the two sealing surfaces. Preferably, the polished metal surface of the base extends under the reticle seating position and is spaced from the reticle providing a gap of 0.003 to 0.007 inches preferably 0.004 to 0.005 inches between the reticle and the polished or ultra planar central metal surface of the base. Thus, the exterior sealing surface of the base may be formed simultaneously with the diffusion barrier between the reticle and base, minimizing manufacturing costs and also minimizing the foot print of the inner pod. The outer pod can comprise a cover portion and a door that seals and latches to the cover portion.

A diffusion filter utilizing only a pair of opposing planar surfaces, such as plates, that may be positioned on the top cover for providing pressure equalization on either of the pods. Such filter may comprise a path through opposing surfaces having a gap of a few thousandths of an inch. The pathway will extend tortuously from interior the pod to exterior the pod. The filter may be fabricated by laser welding a cover panel on a base piece that has a groove a few thousandths thick formed therein. The two pieces are place in contact with one of the two pieces preferably transparent or translucent and the other opaque or of sufficient opacity to absorb laser energy. The laser beam is transmitted through the transparent piece to the other piece where it is absorbed heating the juncture of the two pieces at that point welding them together. Such a filter does not utilize filter media such as woven materials, fabrics, sintered material or the like and the potential for particulate generation associated with such media is eliminated.

Another embodiment may also include a series of latches that latch the base or door of the pod to the cover and provide a uniform clamping force around the pod perimeter. The spherical balls mounted on the base or door and upon which the reticle rests are sized to allow a specified distance between the reticle patterned surface and the surface of the door. This layer presents a diffusion barrier to prevent particle migration to the critical area of the reticle. Another configuration of the invention may include continuous and complementary "flat" surfaces near the perimeter of the door and cover respectively. Upon mating the cover with the door, the flat surfaces abut on each other creating a seal to prevent migration of particulates into the interior of the pod from an environment external to the pod thereby eliminating the need for a traditional elastomeric seal.

In still another embodiment of the invention, a first or inner pod, also known as a cassette, is contained in a second or outer pod or package. The outer pod may be what is known in the art as a standard mechanical interface (SMIF) pod. The inner pod has a top cover that mates with a base to form an enclosure for protectively containing a reticle or mask. The top cover of the inner pod is provided with at least one aperture adapted to receive a locator pin having a tapered surface such as a frustum or cone on one end. The locator pin is configured and positioned for retractable engagement between the tapered surface and an edge of a reticle positioned within the enclosure of the inner pod. In one configuration, the top cover is fitted with a plurality of such locator pins, and the outer package is designed to engage the pins upon assembly of the outer package. As the outer package is brought into engagement with the cover of the inner pod, the locator pins are simultaneously engaged and pushed into the inner pod so that the tapered surface of the pins contact the upper edges of the reticle causing the reticle to be urged into proper lateral position within the enclosure. An elastomeric pad attached to the top cover portion of outer pod may be used to engage the pins and push the pins inward. Other elastomeric pods may contact the top surface of the top cover of the inner pod.

In another embodiment, a pair of spring rollers are mounted on the door or base at opposed corners of the pod. The spring rollers provide horizontal reticle alignment with minimal abrasion.

In another embodiment a spring clamp mounted on the cover for keeping the reticle engaged with the spherical projections. Li an exemplary embodiment, each spring clamp is mounted to the cover at a first end and is provided with a spherical retention projection at an opposed end. In an alternate embodiment, the spherical retention projection may be a spherical ball, in which the spring clamp holds the spherical ball against the reticle. The stiffness of the spring is selected to provide a minimal deflection of the spring in the horizontal direction, i.e. along the surface of the reticle when it is supported in the container. The permissible deflection is primarily in a vertical direction and normal to the patterned surface of the reticle thus providing reticle retention force to retain the reticle in position within the spherical projections but by making point contact with the reticle surface opposite the patterned surface. In one embodiment, the invention features complementary "flat" surfaces one each on the perimeter of the door and cover respectively. Upon mating the cover with the door, the two surfaces abut against each other creating a seal to prevent migration of particulates into the interior of the pod from an environment external to the pod thereby eliminating the need for a conventional electrometric seal.

An advantage of certain embodiments of the invention is to provide a minimal internal volume to reduce the amount of air transferred during, pressure equalization. Moreover, certain embodiments provide a minimal footprint of the inner pod.

An advantage of certain embodiments of the invention is to minimize the contact area on the mask with spherical contacts on the bottom and edge contact on top of the mask.

Another advantage of certain embodiments of the invention is to provide a surface to seal cover and base plate eliminating the traditional elastomeric seal and attendant particle generation. The filter in the cover eliminates the need for traditional filter media.

Another advantage of certain embodiments of the invention is to create a diffusion barrier that protects or prevents particles from migrating onto the quality surface of the mask.

An advantage of the various embodiments of the invention is the restraint of the reticle against movement in and perpendicular to a plane of the patterned surface of the reticle whilst maintaining minimal contact between the reticle and the container.

Another advantage of certain embodiments of the present invention is to minimize the contact area on the mask with spherical contacts on the bottom and line contact on the edges or edge corner contact on top of the mask.

Still another advantage of the present invention is the minimalization of mask motion within the inner pod during shipment, hi this respect, the present invention provides a means of properly locating a reticle within a reticle or mask carrier while constraining relative motion between the reticle and the cover both in the plane and perpendicular to the plane of the patterned surface to thereby minimize surface damage to the reticle inflicted by shock and vibration induced movement of the reticle during transport and shipment. Also, with the present invention, manual positioning of the reticle within the reticle container or on reticle supports, for example, is not required to be precise because the reticle is precisely centered by the structures that locate the reticle.

Additional advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The invention may be described in its different embodiments as follows.

A container for holding reticles, the reticle having a periphery, a top surface, a bottom surface, a side surface, four peripheral corners, a top edge and a bottom edge, the container comprising a base having a periphery, and a top upwardly facing horizontal surface with a plurality of contact elements extending upwardly, the contact elements having a rounded top surface for engaging the reticle on the bottom surface, the base plate further having a plurality of posts positioned to constrain the periphery of the reticle, the top surfaces of the contact elements and the plurality of posts defining a reticle seating position, the upwardly facing horizontal surface further having a sealing surface extending around the base at or proximate to the periphery of said base; a cover for engaging the top surface of the base plate along the base plate periphery, thereby defining an interior for holding the reticle, the cover having a downwardly facing horizontal planar sealing surface for cooperating with the sealing surface of the top upwardly facing horizontal surface of the base to create a seal therebetween when said respective surfaces are in contact.

The above container wherein the base plate is formed at least primarily of metal at the and wherein the top surface is continuously planar and integral from the sealing surface to below the reticle seating position of the reticle.

The above containers wherein the downwardly facing horizontal planar sealing surface is formed of metal whereby there seal between the base and cover is metal to metal.

The above containers wherein the posts are formed of metal and have a top portion with a bevel slanted toward the reticle seating position.

The above containers wherein the posts have a vertical portion that is laterally adjacent the side surface of the reticle when the reticle is seated in the reticle seating position.

The above containers wherein the bevel of each of the plurality of posts defines the reticle seating position whereby the reticle seats on said bevel portions.

The above containers wherein each of the plurality of contact elements comprises a sphere.

The above containers where in the sphere is press fit downwardly into a recess or hole extending downwardly from the top upwardly facing horizontal surface.

The above containers wherein the bottom plate has a plurality of holes from the bottom side of the bottom plate for receiving the spheres each sphere is held therein by set screws.

The above containers further comprising an outer cover and a door receivable within the outer cover to define an interior, the outer cover and outer base sized to receive the above containers.

The above containers wherein the cover comprises a plurality of vertically moveable reticle posts slidably positioned in the cover, the posts positioned to engage the top edge of the reticle.

The above containers wherein the each of the moveable reticle posts are resiliently positioned in the cover.

The above containers wherein each of the moveable reticle posts has a beveled portion to engage the upper edge of the reticle to urge and constrain the reticle into the reticle seating position.

The above containers further comprising a plurality of members attached to the container and moveable laterally, each member biased inwardly for constraining the reticle in position.

The above containers further comprising a filter for pressure equalization, the filter not having filter media and having a pair of confronting planar surfaces separated by a gap providing a diffusion barrier, the filter providing a pathway from the interior of the container to the exterior of the container.

The above containers wherein the gap is 0.001 to 0.007 inches thick.

The above containers wherein the pathway is tortuous having a plurality of corners and path segments.

The above containers wherein the pair of confronting surfaces are fixed to one another and are located on the top surface of the top cover.

The above containers wherein one of the pair of confronting surfaces is part of the top cover and the other is part of the base and wherein the filter is only operative when the top cover is seated on the base.

The above containers further comprising an addition container comprising an additional container top portion and an additional container door receivable and latchable to said top portion, the additional container sized to receive the container of claim 15, whereby said container of claim 15 is an inner container.

The above containers wherein the additional container top portion includes a plurality of resilient members extending downwardly on an inside surface of said top portion, and wherein said resilient members engage the top cover of the inner container.

The above containers wherein the top cover of the inner container comprises a plurality of vertically moveable reticle posts slidably positioned in the cover, the posts positioned to engage the top edge of the reticle, and wherein the resilient members engage said vertically moveable posts.

A container for holding reticles, the reticle having a periphery, a top surface, a bottom surface, a side surface, four peripheral corners, a top edge and a bottom edge, the container comprising a base having a periphery, and a top upwardly facing horizontal surface with a plurality of spheres disposed in the base, each of the spheres positioned primarily below the upwardly facing horizontal surface, the contact elements defining a reticle seating position, the base having an upwardly facing sealing surface at or proximate the periphery of the base; a cover for engaging the top surface of the base plate along the base plate periphery, thereby defining an interior for holding the reticle, the cover having a downwardly facing sealing surface for cooperating with the sealing surface of the top upwardly facing horizontal surface of the base to create a seal therebetween when said respective surfaces are in contact.

The above containers wherein the sealing surface of the base and the sealing surface of the cover are both metal wherein a metal to metal seal is formed when the respective surfaces are engaged.

The above containers wherein the top cover is primarily formed of a polymer and the sealing surface of the top cover is part of a metal ring secured to said polymer.

The above containers wherein the base has a plurality of posts fixed into the base positioned adjacent the reticle seating position.

A above container for holding reticles in combination with a reticle, the reticle having a periphery, a top surface, a bottom surface, a side surface, four peripheral corners, a top edge and a bottom edge, the container comprising a base having a periphery, and a top upwardly facing horizontal surface with a plurality of spheres disposed in the base, each of the spheres positioned primarily below the upwardly facing horizontal surface and extending above the surface a distance of 0.002 to 0.007 inches, the contact elements defining a reticle seating position, the base having an upwardly facing sealing surface at or proximate the periphery of the base; a cover for engaging the top surface of the base plate along the base plate periphery, thereby defining an interior for holding the reticle, the cover having a downwardly facing sealing surface for cooperating with the sealing surface of the top upwardly facing horizontal surface of the base to create a seal therebetween when said respective surfaces are in contact.

The above combination wherein the sealing surface of the base and the sealing surface of the cover are both non-elastomeric.

A dual containment pod for reticles comprising an inner pod and an outer pod, the inner pod comprising a base and a cover that cooperates with said base, the inner pod having a reticle seating position therein, the outer pod comprising a container portion and a base cooperating with the container portion, the outer pod sized for receiving the inner pod.

The above dual containment pods further comprising a pressure equalization means that does not have filter media.

The above dual containment pods wherein the pressure equalization means comprises a diffusion filter having a tortuous pathway.

The above dual containment pods wherein the reticle is positioned close enough to the top surface of the base of the inner pod to provide a diffusion barrier to preclude particles from reaching a reticle face facing the top surface of the base.

The above dual containment pods wherein the base of the inner pod comprises a plurality of spheres upon which the reticle seats, each sphere primarily positioned below the top surface of said base.

The above dual containment pods wherein the spheres are comprised of polyamide-imide.

The above dual containment pods wherein the spheres or rotatably mounted in the base.

The above dual containment pods wherein the top cover of the inner pod comprises a plurality of vertically moveable reticle posts slidably positioned in the cover, the posts positioned to engage the top edge of the reticle The above dual containment pods wherein the top portion of the outer pod comprises a plurality of members positioned to engage the vertically moveable reticle posts when the inner pod is seated in the outer pod with the top portion of the outer pod engaging the door.

The above dual containment pods wherein the vertically moveable posts are resiliently mounted to the top cover with a bias toward the reticle when the posts are displaced from their normal position.

A reticle container comprising a base and a top cover, the base having a plurality of reticle engagement members for supporting the reticle, the reticle engagement member comprised of polyamide-imide.

The above reticle containers wherein each reticle engagement member is configured as a sphere positioned in the top cover with a portion of the sphere below a top surface of the base.

BRIEF DESCRIPTION OF THE FIGURES

FIG. 19 is an exploded perspective view of the inner pod of the reticle carrier of FIG. 18;

FIG. 22 is a perspective view of a cover of an inner pod of a reticle carrier according to an embodiment of the invention;

FIG. 23 is a perspective view of the door or base of the inner pod reticle of FIG. 18;

DETAILED DESCRIPTION OF THE DRAWINGS

References to relative terms such as upper and lower, front and back, left and right, or the like, are intended for convenience of description and are not contemplated to limit the invention, or its components, to any one positional or special orientation. "Connect" and "engage" and "attach" and various forms of these words when used herein do not require direct element to element contact unless otherwise inferred or required by the context, intermediate linking components may be used and still fall within the intended meaning of these words. All dimensions depicted in the figures may vary with a potential design and the intended use of a specific embodiment of this invention without departing from the scope thereof.

Each of the additional figures and methods disclosed herein may be used separately, or in conjunction with other features and methods, to provide improved containers and methods for making and using the same, therefore, combinations of features and methods disclosed herein may not be necessary to practice the invention in its broadest sense and are instead disclosed merely to particularly describe representative embodiments of the instant invention.

Figure 1:
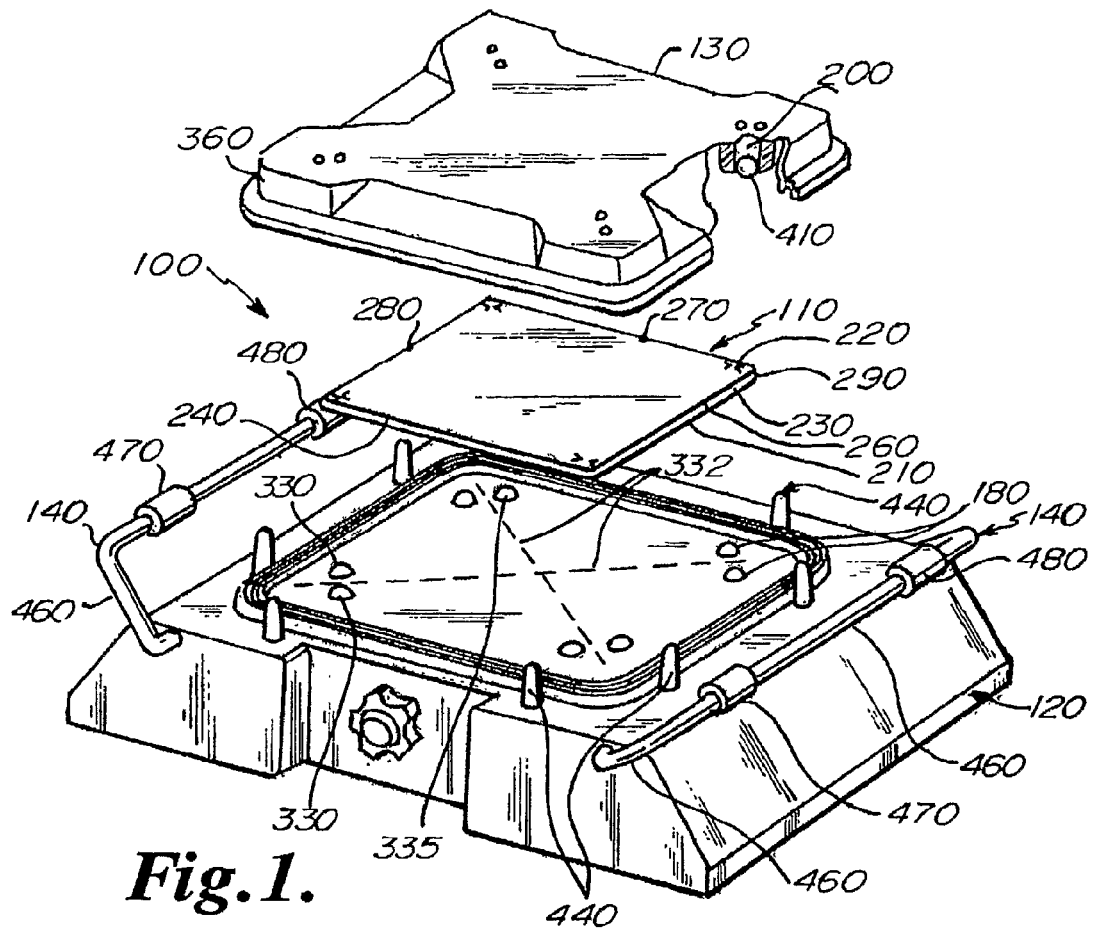
FIG. 1 is an exploded perspective view depicting a container equipped with a reticle support mechanism according to an embodiment of the invention.
Figure 2:
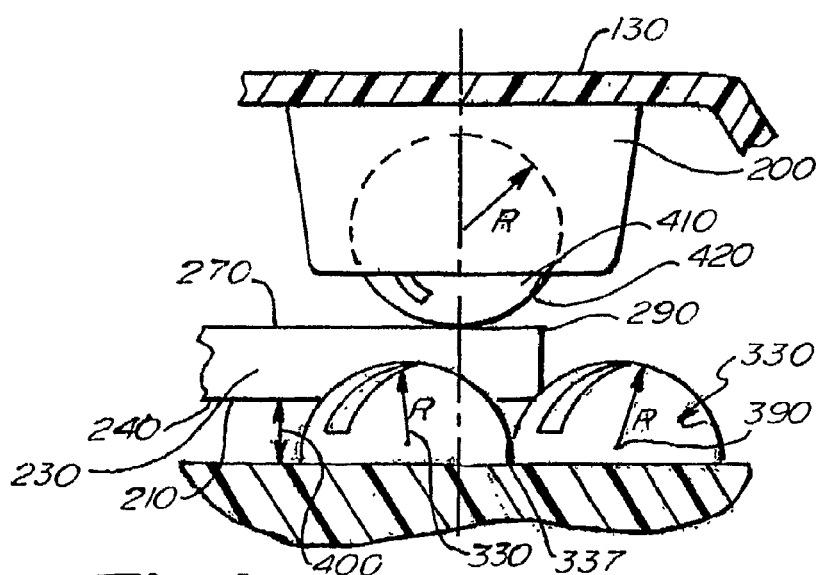
FIG. 2 is a partial cross-sectional side view depicting the reticle positioning and reticle retention balls of FIG. 1.

Referring to FIG. 1, a container 100, used for storing and transporting a reticle 110, generally includes a base 120 capable of engagement with a cover 130 to form a hermetically sealed enclosure 124 (FIG. 4) suitable for containing the reticle 110. The particular reticle depicted in FIG. 1 is generally rectangular in shape, having four corners (e.g. corner 290). Container 100 further includes a latch 140 rotatively coupled to the door 120. Latch 140 is adapted to removably maintain the engagement between the door 120 and the cover 130 against external loads encountered by the container 100 during shipping and transport. Reticle 110 is located by and supported near each of the corners 290 on reticle positioning members 180 mounted to the door 120. Reticle retainers 200 extend from the cover 130 are brought into contact with the reticle 110 upon engaging the cover 130 with the door 120 as seen in FIG. 2. Reticle 110 is thus secured between the reticle positioning members 180 and the reticle retainers 200.

Reticle 110 may have a first patterned surface 210 opposite a second chucking surface 220 spaced apart from the first patterned surface 210 by a lateral surface 230. First patterned surface 210 intersects lateral surface 230 at first and second lower pair of parallel edges 240 and 260 respectively. Second chucking surface 220 intersects lateral surface 230 at first and second upper pair of parallel edges 270 and 280 respectively. Typically, first and second lower pair of edges 240 and 260 are parallel to respective first and second upper pair of edges 270 and 280, each corresponding pair of parallel edges of a surface blends with the other corresponding pair of parallel edges at corners 290 which may be radiused. The patterned surface 210 may be etched with a circuit pattern (not depicted). The chucking surface 220 may be used as a reference surface during the manufacture and handling of the reticle. For example, surface 220 may be held in an electrostatic chuck. Although the invention is described with reference to a rectangular shaped reticle, it will be apparent to one of skill in the art that reticles of all shapes are within the scope of the invention. Reticles may be, but are not limited to, polygonal or square shaped reticles.

Figure 3:
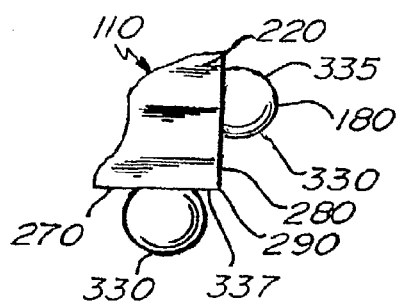
FIG. 3 is a partial plan view depicting a pair of reticle positioning balls of FIG. 1.

Referring to FIGS. 2 and 3, and also illustrated in FIG. 1, reticle positioning members 180 extend from base 120 on an interior surface 340 of the door 120. Interior surface 340 forms a boundary of the enclosure 124 formed when cover 130 engages with door 120. In one embodiment, reticle positioning members 180 comprise a plurality of substantially identical projections 330 (e.g. a plurality of balls or hemispheres) each having a spherical surface 335, arranged in a regular pattern on the interior surface 340 of the base 120. The projections 330 are located and dimensioned to support the reticle 110 proximate the corners 290 along portions of the first and second lower pair of edges 240 and 260 such that the first and second lower pair of edges 240 and 260 are disposed in a tangential relationship to and in point contact with, spherical surfaces 335. While the container 100 may be of various shapes, one embodiment illustrated in FIG. 1 depicts a container 100 having a shape that generally conforms to the shape of the reticle 110 in that it includes corners 360 on cover 130 that correspond to corners 290 of the reticle 110. In this embodiment, pairs of spherical projections 330 are located proximate each corner 360 of base 120 with reticle 110 being positioned inside enclosure 124 so as to contact spherical surfaces 335 such that corners 290 are disposed in substantial alignment with the corners 360 on cover 130, as depicted in FIGS. 1 and 3.

Figure 9:
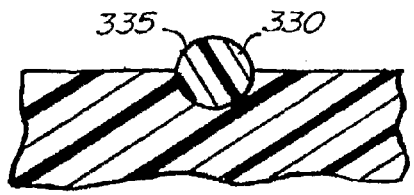
FIG. 9 is a front sectional view illustrating the embedding of a spherical ball in the base according an exemplary embodiment of the instant invention.
Figure 10:
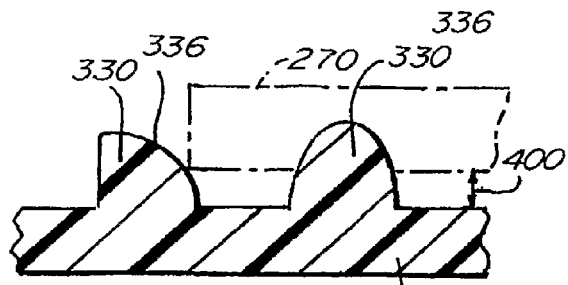
FIG. 10 is a sectional view illustrating a reticle resting on a pair of contiguous spherical projections.

Also, as depicted in FIGS. 2, 3, 6-10 and 13, each pair of spherical projections 330 is positioned and/or mounted so that each spherical projection 330 is located adjacent to each other on either side of one of the two diagonals 332 (dotted in FIG. 1) extending between paired corners 290 on base 120 of container 100. The projections may be formed by spherical balls 330 embedded in the base 120, as illustrated in FIG. 9 for example, and presenting a spherical surface 335 or they may be formed by convex surfaces 336 depicted in FIGS. 6, 7, 8 and 10. The convex surfaces may be integrally formed with the container. In this configuration, each contiguous pair of spherical balls 330 presents complementary portions 337 of spherical surfaces 335 that generally incline towards an interior of enclosure 124 and towards interior surface 340.

Taken together, the complementary portions 337 constitute a reticle locating and positioning structure wherein a reticle 110 is positioned on the spherical projection 330 with the patterned surface 210 facing interior surface 340. By aligning corners 290 substantially with the corners 360 on cover 130 of container 100, placement of the reticle 110 onto the reticle positioning members 180 cause the reticle 110 to self-align and be retained within the reticle positioning members 180. First and second lower (upper)) pair of edges 240 (270) and 260 (280) are thereby disposed substantially planar and parallel to interior surface 340. In this configuration, each of first and second lower (upper) pair of edges 240 (270) and 260 (280) are placed in point contact along a tangent 338 at complementary portions 337 of spherical surfaces 335, best depicted in FIG. 13. A radius (R) 390 of spherical balls 330 is selected to keep the reticle 110 at a predefined height above interior surface 340, as depicted in FIG. 2. Surface 340 and reticle 110 thereby define a diffusion barrier 400 between the reticle and the door. The diffusion barrier 400 is sized to inhibit or present a barrier to the diffusive flow of particles into the diffusion barrier 400, thereby causing the particles to take alternate paths away from the patterned surface of the reticle.

Three dimensional geometries may be utilized in place of the spherical projections 330 to effect the same positioning function while making only point contact with the reticle 110. For example, a cone or frustum geometry will engage the lower pair of edges 240 and 260 and provide only point contact. Other geometries may become evident to the skilled artisan.

Reticle retainers 200 are mounted on or otherwise extend from the cover 130, as illustrated in FIGS. 1 and 2. As can be seen in the cross-sectional side view of the container 100 of FIG. 2, each reticle retainer 200 comprises a spherical retainer projection 410, which may be a ball, with a spherical bearing surface 420. Upon engaging the cover 130 with the door 120, a portion of the spherical bearing surface 420 is brought into forced contact with chucking surface 220 at a point 430 on the chucking surface 220, best depicted in FIG. 14. In one embodiment, each point 430 is located so that the line of action of the force exerted by the chucking surface 420 at the point 430 passes through one of the diagonals 332 of the container 100 so as to prevent asymmetric loading of the reticle, which might cause the reticle to tilt up from the reticle-positioning members 180. Reticle 110 is thereby rigidly secured between the reticle-positioning members 180 and the reticle retainers 200 when the cover 130 is brought into engagement with the door 120.

Spherical projection 330 and spherical retainer projection 410 may be manufactured from low particulate generating material and press fit into their respective locations on the door 120 and cover 130. In an exemplary embodiment of the invention, spherical projection 330 and retainer balls 140 can be the type of spherical balls found in the raceway of a ball-bearing, for example. In yet another embodiment, spherical projections 330 or retainer projections 410 may be configured to rotate about one or more axes passing through the centers of the balls, thereby causing the balls to rotate upon being contacted by any portion of the reticle. Such an arrangement may reduce particulate generation arising from abrasion attendant sliding friction between the reticle positioning members 180 or reticle retaining members 200 and the reticle 110. In such an arrangement, an additional bottom surface engaging projection 333 (dotted in FIG. 12) may be appropriate that engages the edge rather than the side surface of the reticle. Another aspect of the invention is depicted in FIG. 1. A plurality of vertical posts 440 are mounted to or otherwise project from the door 120. The cover 130 cooperates with the vertical posts 440 to register the cover 130 to door 120, enabling repeatable and non-sliding contact between spherical bearing surfaces 420 and chucking surface 220 at points 430.

Once the cover 130 is engaged with door 120, the latch 140 is actuated to maintain the engagement between the door 120 and the cover 130. Referring again to FIGS. 1, 4 and 5, there is an illustration of a perspective and side views of embodiments that utilize two "U" shaped, resilient load bars 460 rotatively coupled to door 120 and spaced from each other. Rollers 470, 480 and a hand-graspable tab 490 may be provided on each "U" shaped load bar 460. The resilient load bars 460 may be kinematically coupled (not depicted) to allow synchronous rotation whereby the load bars 460 may rotate in union but in opposing directions.

Figure 4:
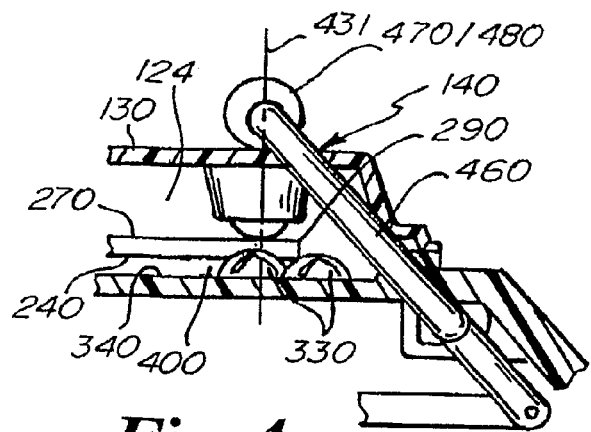
FIG. 4 is a partial side view depicting a latch and load bars according an exemplary embodiment of the invention.
Figure 5:
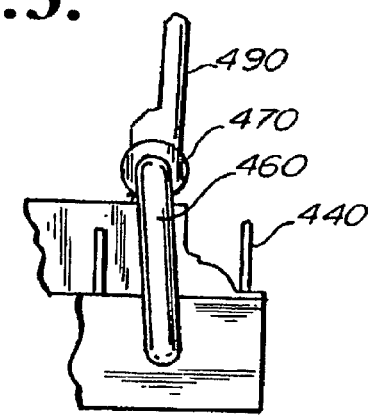
FIG. 5 is a partial side view depicting a latch and load bars according an exemplary embodiment of the invention.
Figure 6:
FIG. 6 is a schematic view of the spherical projection in an embodiment of the invention.
Figure 7:
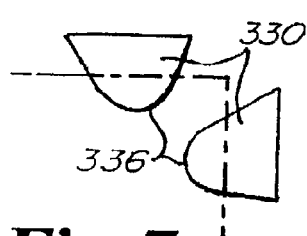
FIG. 7 is a plan view of a contiguous pair of spherical projections in an embodiment of the invention.
Figure 8:
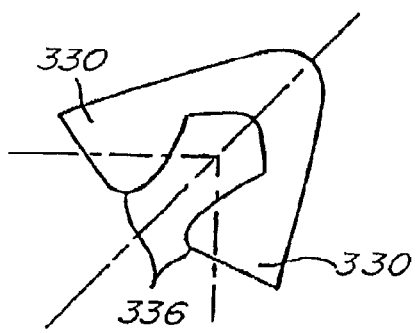
FIG. 8 is a plan view of a contiguous pair of spherical projections formed as a monolithic structure according to an embodiment of the invention.

In operation, cover 130 is engaged with door 120 and using tab 490 one or both load bars 460 are rotated until rollers 470, 480 are positioned over and in contact with cover 130, as portrayed in FIG. 4. Load bars 460 and rollers 470, 480 are shaped and dimensioned to locate rollers 470, 480 so as to apply a compressive force on cover 130 along a line or axis 431 passing through contact points 430 between spherical bearing surfaces 420 and chucking surface 220. With this arrangement, the load bars 460 provide uniform closure force and locate clamping force directly over spherical retainer balls 410. In other embodiments, other latching mechanisms may provide damping force directly on the region of the cover corresponding to the engagement of the reticle by the retainer projection 410.

Figure 11:
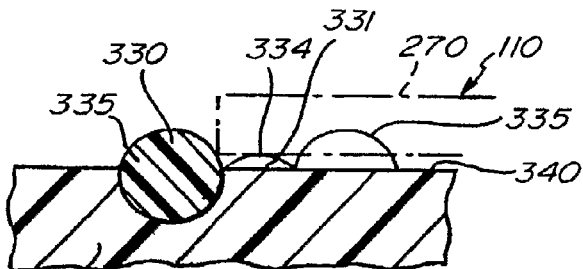
FIG. 11 is sectional side view depicting an auxiliary convex projection providing an abutment surface to the reticle self-positioned on the spherical projections.
Figure 12:
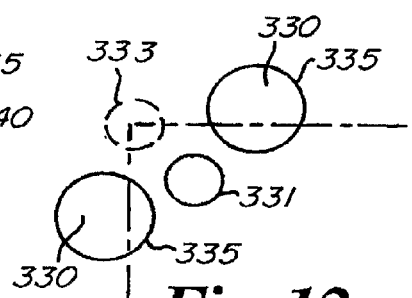
FIG. 12 is a plan view depicting the auxiliary convex projection according to an exemplary embodiment of the invention.
Figure 13:
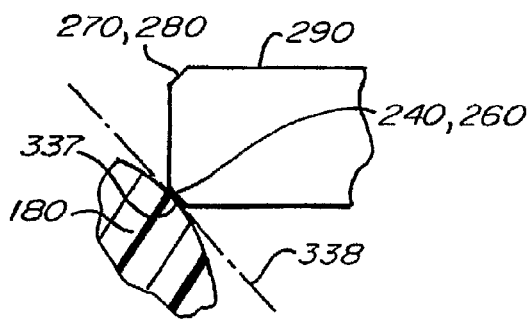
FIG. 13 is a schematic illustrating the tangential contact between the edge of the reticle and the spherical projections.
Figure 14:
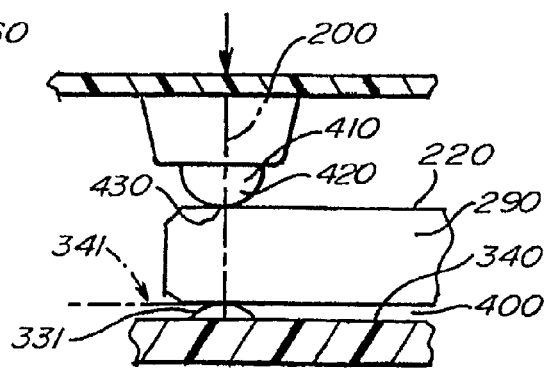
FIG. 14 is a partial cross-sectional side view depicting the reticle supported on the auxiliary convex projection on the base and contacted by the reticle retention ball on the door according to an exemplary embodiment of the invention.

In an alternate embodiment depicted in FIGS. 11, 12 and 14, the base is equipped with at least one auxiliary projection 331 disposed proximate spherical projection 330. The convex projection 331 has a distal end 334 that provides an abutment to the patterned surface 210 after reticle 110 is in equilibrium with reticle positioning members 180, thereby constraining reticle 110 to lie on a plane 341 (FIG. 14) defined by the distal ends 334 of the convex projections 331 that is substantially parallel to interior surface 340 of door 120.

Referring to FIGS. 15, 15A 16 and 17, another embodiment of a reticle container 500 according to the invention is depicted. A door or base 502 and a cover 504 cooperate to form an enclosure 506. A plurality of reticle positioning members 508 are mounted on a surface 510 of door 502. Reticle positioning members 508 may comprise a plurality of substantially identical spherical balls 512 arranged in a regular pattern (not depicted) on the surface 510 and dimensioned to support a reticle 514 substantially parallel to surface 510 by contacting peripheral, non-functional portions of the surface 510 proximate corners 516 of container 500. Reticle retainers 518 are mounted on the cover 504.

Figure 15:
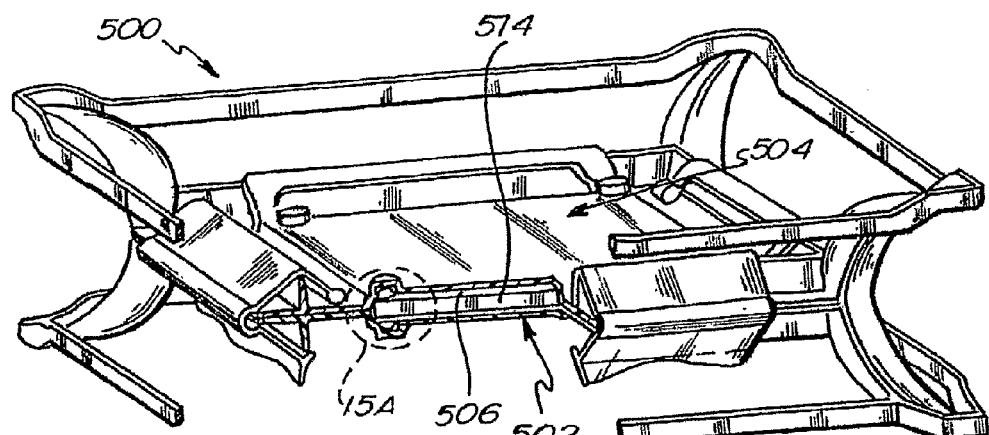
FIG. 15 is a perspective view of an assembly of a container in an embodiment of the invention.
Figure 16:
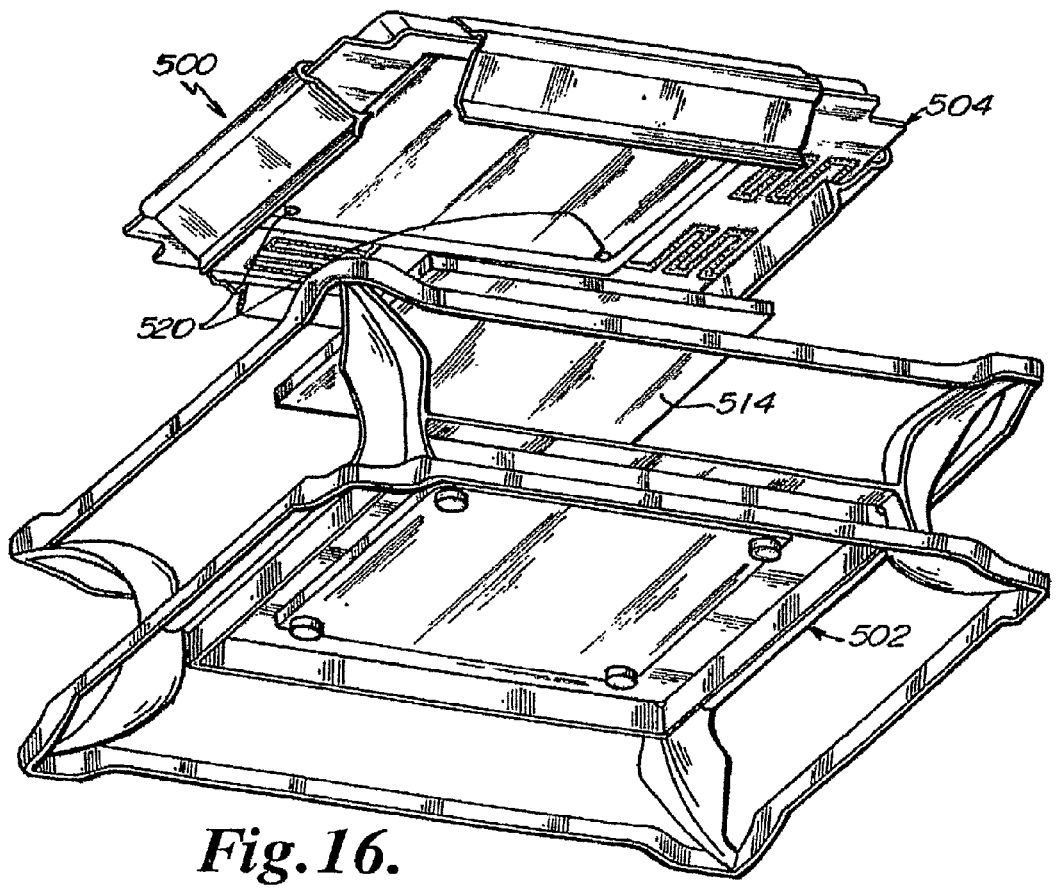
FIG. 16 is an exploded perspective view of the container of FIG. 15.
Figure 17:
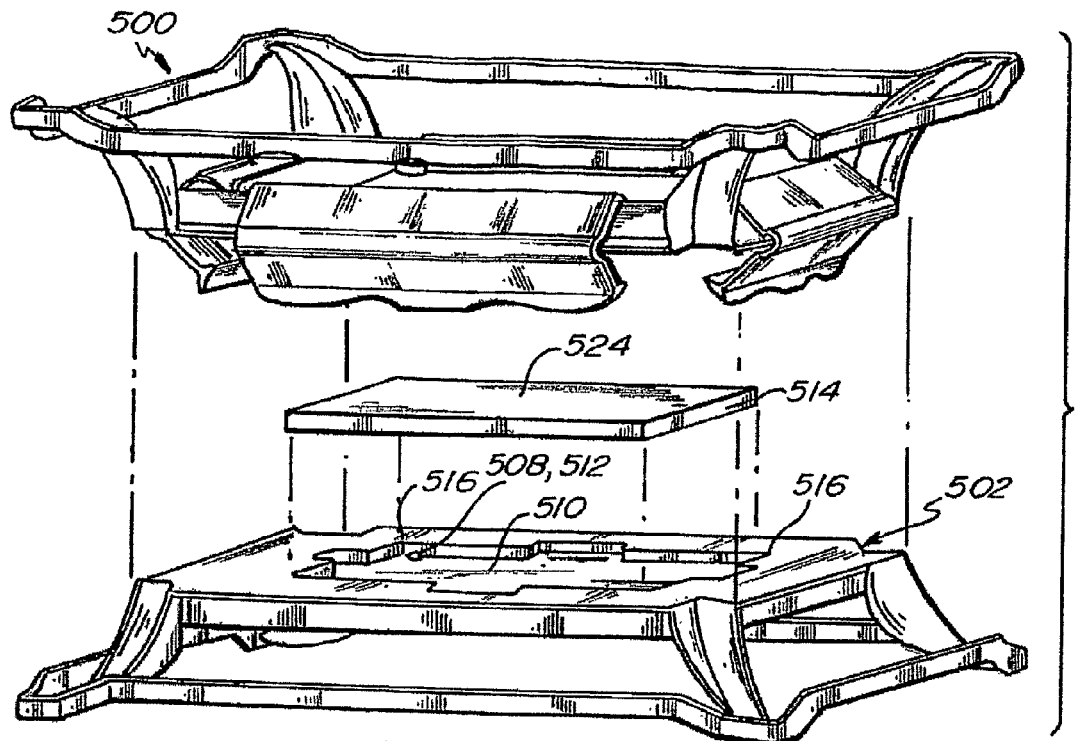
FIG. 17 is an exploded perspective view of the container of FIG. 15.
Figure 15A:
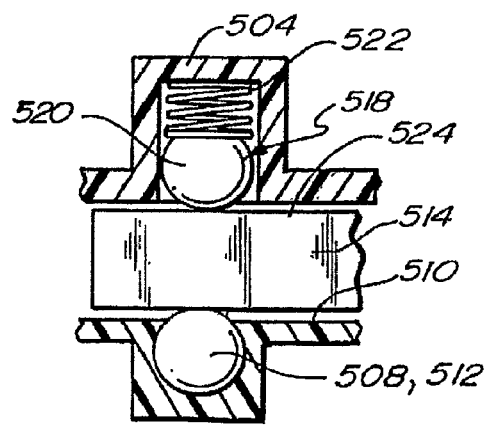
FIG. 15A depicts the detail of the retainer mechanism of FIG. 15 in cross-section.

As depicted in FIG. 15 A, each reticle retainer 518 comprises a spherical retainer ball 520 attached to the cover 504 by a spring clamp or spring cushion 522. Upon engaging the cover 504 with the door 502, spherical retainer ball 520 is brought into contact with a chucking surface 524 on the chucking surface deforming spring clamp 522 along a vertical direction. Spring clamp 522 is configured so that it deflects more in the vertical direction than it does in the horizontal direction. Once the cover is mated to the door and the latch engaged, the spring clamp 522 prevents relative sliding between the surfaces even when the container is subject to shock and vibration loading. Reticle 514 is thereby securely retained between reticle positioning members 508 and reticle retainers 518 with only point contact between reticle 514 and the reticle retainers 518. Spherical balls 512 and spherical retainer balls 520 may be manufactured from low particulate generating material and press fit into their respective locations on the door 502 and cover 504.

The spherical balls and projections depicted in the various embodiments (e.g. 330, 331, 410, 512 and 520) may be manufactured from a low particulate generating material. In an example embodiment, the low particulate generating material is a polyamide-iniide (PAD, a reaction product of trimellitic anhydride and aromatic diamines. PAI is called "amide-imide" because the polymer chain comprises amide linkages alternative with imide linkages.

One such PAI is sold under the brand name TORLON, is a registered trademark of Solvay Advanced Polymers. TORLON is a high performance amorphous (noncrystalline) engineering thermoplastic. The combination of aromatic groups and imide linkages are responsible for the polymer's exceptional thermal stability. The amide groups impart flexibility and elongation, which results in an engineering plastic with exceptional toughness. TORLON is the highest performing melt processable plastic. It has superior resistance to elevated temperatures, capable of performing under severe stress conditions at continuous temperatures to 500.degree. F. (260.degree. C.). Parts machined from TORLON stock shapes provide greater compressive strength and higher impact resistance than most advanced engineering plastics. Its relatively low coefficient of linear thermal expansion and high creep resistance provide dimensional stability over a wide use range.

TORLON is an amorphous material with a glass transition temperature (Tg) of 537.degree. F. (280.degree. C.). TORLON 4301 (Bearing Grade), supplied by Boedeker Plastics, Inc. of Texas USA, may be advantageously used in an exemplary embodiment of the invention. TORLON 4301 extruded PAI is primarily used for wear and friction parts. It offers a very low expansion rate, low coefficient of friction and exhibits little or no slip-stick in use. The flexural modulus of TORLON 4301 is 1,000,000 psi, higher than many advanced engineering plastics. This grade excels in severe service wear applications such as non-lubricated bearings, seals, bearing cages and reciprocating compressor parts.

Other grades and compositions of polymers that are structurally similar to PAI may be used without departing from the scope of the invention. In particular, TORLON exhibits relatively low particulate generation ensuring that the environment 132 within the EUV pod 100 is maintained substantially particulate free. Such an arrangement significantly eliminates almost all particulate generation arising from abrasion due to sliding friction between the reticle positioning/retaining members and the reticle.

TORLON is injection moldable but nonconductive. In embodiments where static dissipation is required, a static dissipative reinforced polyamide-imide material such as SEMITRON (e.g. SEMITRON ESd 520HR) may be advantageously used. SEMITRON is a trademark of Quadrant Engineering Plastics Products. One of skill in the art will recognize that other engineering polymers with a structure and/or properties similar to that of TORLON may also be advantageously used.

In another exemplary embodiment of the invention, spherical balls 512 and retainer balls 520 may be fabricated from a metal, such as stainless steel. Materials suitable for use in the race of a ball bearing assembly, for example, are candidate materials because of their relatively high resistance to wear, hi yet another embodiment, spherical balls 512 and/or retainer balls 520 may be mounted to the door and/or cover so as to be rotatable about one or more axes passing through the centers of the balls thereby causing the balls to rotate upon being contacted by any portion of the reticle. Such an arrangement mitigates sliding friction between the reticle positioning/retaining members 508, 518 and the reticle 514.

Figure 20:
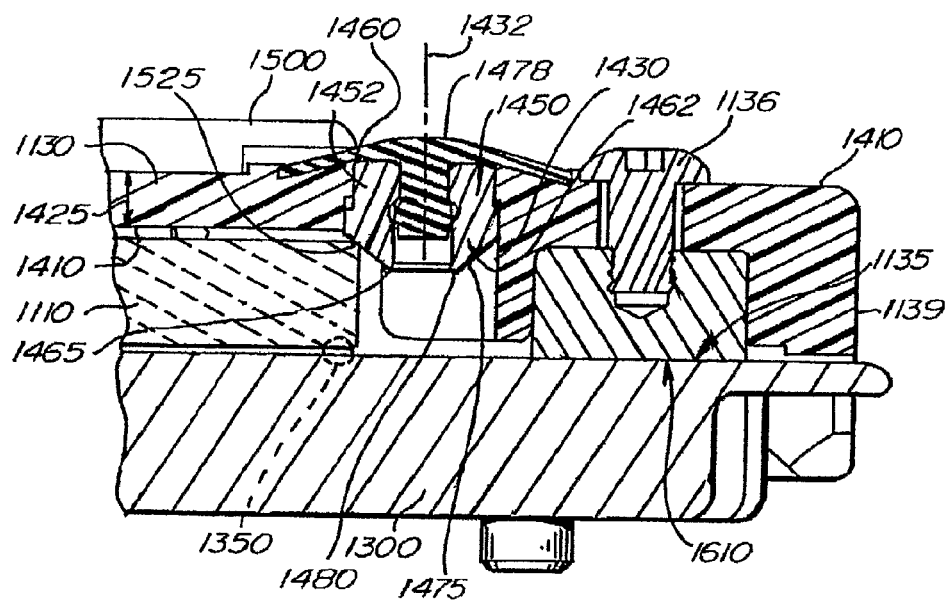
FIG. 20 is a cross-sectional side view illustrating a locating pin according to an embodiment of the invention.
Figures 30, 31:
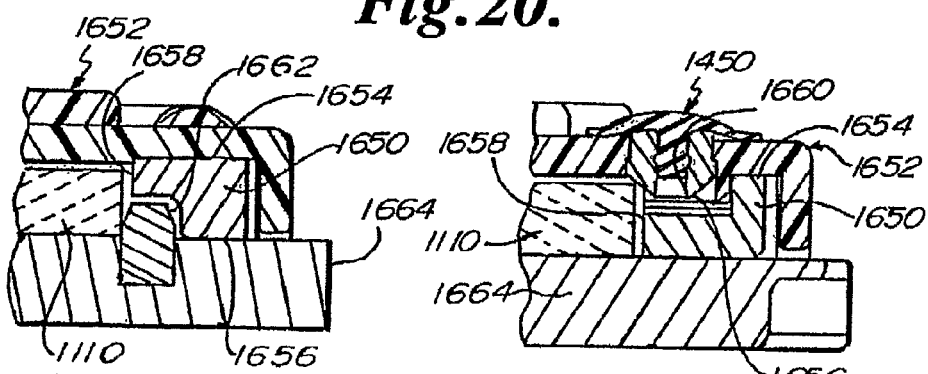
FIG. 30 is a cross-sectional view of a guide post in cooperation with the rigid seal
FIG. 31 is a cross-sectional view of the locating pin detail of FIG. 29.
Figure 21:
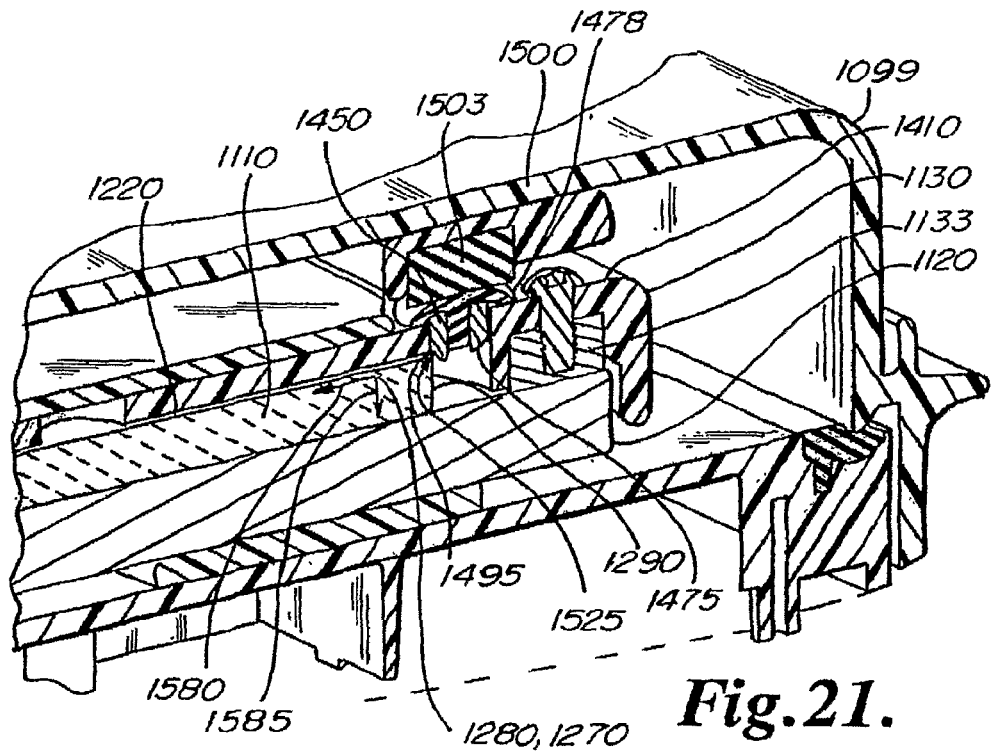
FIG. 21 is a perspective cutaway view of an inner pod in an outer pod according to embodiments of the invention.

Referring to FIGS. 18 through 26, embodiments depicting other aspects of the invention are illustrated. A container 1099, depicted in phantom, is an outer package or pod, configured, for example, as a reticle SMIF pod container such as is illustrated in U.S. Pat. Nos. 6,513,654; 6,216,873; and 6,824,916. Said patents are owned by the assignee of the instant application and are hereby incorporated by reference herein in their entirety. Rather than holding a reticle, the assembly holds an inner pod or cassette 1100 which then holds for storing and transporting a reticle (or mask) 1110, such as an EUV reticle, and generally includes a door 1120 (interchangeably referred to as the base of the pod) capable of engagement with a cover 1130 to form a sealed enclosure 1132 suitable for containing the reticle 1110. In FIGS. 19 through 21, the cover 1130 seals to the base 1120 by way of a rigid seal ring 1133 that engages the sealing surface 1135 of the base 1120. The rigid seal ring may be secured to the cover by threaded fasteners 1136, such as for example cap screws, that are peripherally disposed adjacent an outer edge 1139 of the cover 1130.

Figure 18:
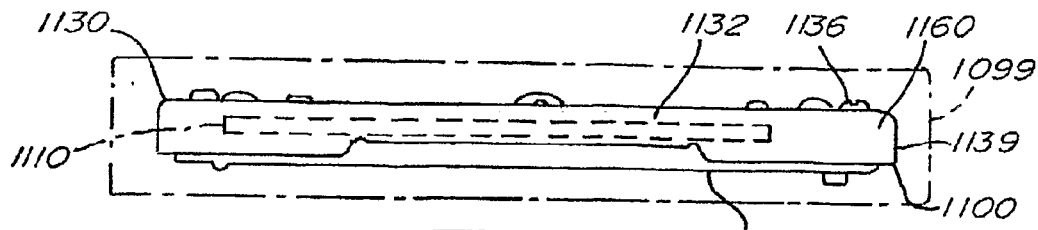
FIG. 18 is a side elevational view of an inner pod of a reticle carrier according to an embodiment of the invention.

An exploded view of the FIG. 18 embodiment is depicted in FIG. 19. The reticle 1110 is depicted as substantially rectangular in shape with a first surface 1210 opposite a second surface 1220 spaced apart from the first surface 1210 by a lateral surface 1230. The first surface 1210 intersects lateral surface 1230 at first and second lower pair of parallel edges 1240 and 1260 respectively. Second surface 1220 intersects lateral surface 1230 at first and second upper pair of parallel edges 1270 and 1280 respectively. In a typical rectangular shaped reticle, first and second lower pair of edges 1240 and 1260 are parallel to respective first and second upper pair of edges 1270 and 1280, each corresponding pair of parallel edges of a surface blends with the other corresponding pair of parallel edges at radiused corners 1290. In an alternate embodiment, the first surface 1210 may be etched with the desired circuit pattern (not depicted) and the second surface 1220 may be used as a reference surface during the manufacture and handling of the reticle. For example, surface 1220 may be held in an electrostatic chuck. The reticle 1110 may be located and supported near each of its corners on reticle contact members 1350 mounted to the door 1120. The reticle contact members 1350 may be mounted to the door 1120 in a manner known in the art. Although the invention is described with reference to a square shaped reticle, it will be apparent to one of skill in the art that a reticle of other shapes such as for example, a rectangular, polygonal or circular shaped reticle, may be used without departing from the scope of the invention. The illustrated embodiment of FIG. 19 depicts a container 1100 having a shape that generally conforms to the shape of the reticle 1110 in that it includes corners 1160 that correspond to radiused corners 1290 of the reticle 1110. However, one of skill in the art will readily recognize the container 1100 may have other shapes such as for example, a rectangular, polygonal or a circular shape without departing from the scope of the invention.

In FIGS. 19 and 23, an inner pod door or base 1120 according to an embodiment of the invention is depicted. Base 1120 generally conforms to the shape of the reticle and includes a base plate 1300 with opposed first and second major parallel surfaces 1305 and 1306 and radiused corners 1345. Patterned surface 1210 of the reticle 1110 may be disposed facing major surface 1305. Base plate 1300 includes a continuous contact sealing surface 1135 near the perimeter of first major surface 1305. Generally, the entire first major surface 1305 may be provided with a uniform surface finish. Alternatively, the sealing surface 1135 is provided with a first surface finish 1320 and the remaining portion of the first major surface 1305, which is exposed to the interior of the enclosure 1132 formed when cover 1130 engages with base 1120, is characterized by a second surface finish 1325.

As depicted in FIGS. 19 and 24 through 26, reticle guides 1330 are mounted to inner pod door or base 1120 on the first major surface 1305. Reticle guides 1330 comprise a plurality of substantially identical posts 1310 fixedly attached to the door 1120 on base plate 1300 and extending outwardly from the first major surface 1305 to terminate at a post-end portion 1335. In certain embodiments, post-end portions 1335 are shaped so as to present a tapered surface 1340 sloping so as to present a substantially frusto-conical shape with an apex proximate the post-end portion 1335. The posts 1310 having the tapered surfaces 1340 are arranged in a regular pattern on the surface 1305 and dimensioned to restrain the reticle 1110 proximate its corners 1290 along portions of the first and second lower pair of edges 1240 and 1260 such that the first and second lower pair of edges 1240 and 1260 may be disposed in a tangential relationship to and in point contact with the tapered surfaces 1340 such that radiused corners 1290 of the reticle 1110 are disposed in substantial alignment with the radiused corners 1345 of the base plate 1300 as illustrated in FIGS. 19 and 23.

It will be readily evident to one of skill in the art that other configurations of reticle guides 1330 with tapered surfaces 1340 may be used in place of the posts 1310. In particular, spherical balls such as for example, a spherical ball bearing with a spherical surface arranged so that the spherical surfaces contact the reticle 1110 in the manner of the tapered surfaces 1340 of the posts 1310 may be advantageously used without departing from the scope of the invention as illustrated in FIGS. 1-4. The posts 1310 may be of metal, for example steel or aluminum, or may be of other rigid materials, including polymers.

As depicted in FIGS. 19 and 23 the posts 1310 are mounted so that each post 1310 is located adjacent to each other on either side of one of two diagonals 1302 and 1304 extending between paired corners 1360 of container 1100. In this configuration, each contiguous pair of posts 1310 presents complementary portions of tapered surfaces 1340 that generally incline towards an interior of enclosure 1132 and towards surface 1305 of the base plate 1300.

Figure 24:
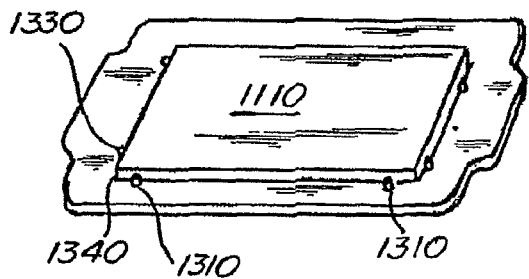
FIG. 24 is a perspective view of the base or door of FIG. 23 with a reticle in place.
Figure 25:
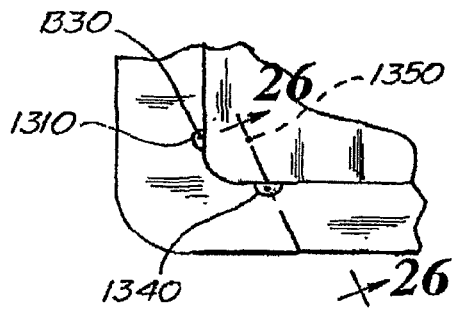
FIG. 25 is a partial plan view of the base of FIG. 24.
Figure 26:
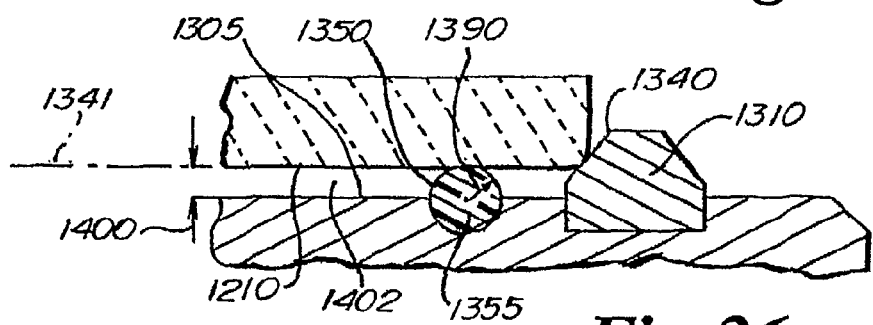
FIG. 26 is a cross-sectional view taken at 26-26 [sigma]f FIG. 25.

Taken together, the complementary portions of the tapered surfaces 1340 constitute a reticle locating and positioning structure, as depicted in FIGS. 24 through 26. The reticle 1110 is positioned on the posts 1310 with the patterned surface 1210 facing surface 1305, with radiused corners 1290 substantially alignment with the corners 1345 of container 1100. The reticle will self-align so as to be retained within the posts 1310 with first and second lower (upper) pair of edges 1240 (1270) and 260 (1280) disposed substantially planar and parallel to surface 1305. In this configuration, each of first and. second lower (upper) pair of edges 1240 (1270) and 1260 (1280) are placed in tangential engagement and in point contact with complementary portions of the tapered surfaces 1340.

In the embodiment of FIGS. 18 through 26, the plurality of reticle contacts 1350 are in the form of a spherical balls or protrusions 1355, one between each pair of posts 1310. The FIG. 19 and FIG. 23 depictions portray the protrusions 1355 as being located on the diagonals 1302 and 1304, equidistant between the reticle guides 1330. However, the location of the protrusions 1355 may be located differently to avoid contact with sensitive portions of the patterned surface 1210.

Referring again to FIG. 26, a radius 1390 of each mask contact 1350 is selected to suspend the patterned surface 1210 of the reticle 1110 at a predefined height 1400 above major surface 1305 of the base plate 1300 and creating a gap 1402 thereby. AU of the mask contacts 1350 may extend above interior surface 1305 at substantially the same height 1400 to define a plane 1341 that is substantially parallel to interior surface 1305. The gap 1402 may be dimensioned to define a diffusion layer or diffusion barrier between the reticle and the door. The diffusion barrier inhibits particles from migrating into the gap 1402, causing the particles to take alternate paths remote from the patterned surface of the reticle. A representative and non-limiting height 1400 of gap 1402 is in the range of 0.001- to 0.010-in.

In the embodiment of FIGS. 18 through 26, the plurality of reticle contacts 1350 are in the form of a spherical balls or protrusions 1355, one between each pair of posts 1310. The FIG. 19 and FIG. 23 depictions portray spherical protrusions 1355 as being located on the diagonals 1302 and 1304, equidistant between the reticle guides 1330. However, the location of the spherical protrusions 1355 may be located to avoid contact with sensitive portions of the patterned surface 1210. For example, spherical protrusions 1355 may be located near the midspan of the edge pairs 1240 and 1260. A three point contact could also be implemented for stable mounting of reticle 1110 and adequate definition of plane 1341.

Figure 27:
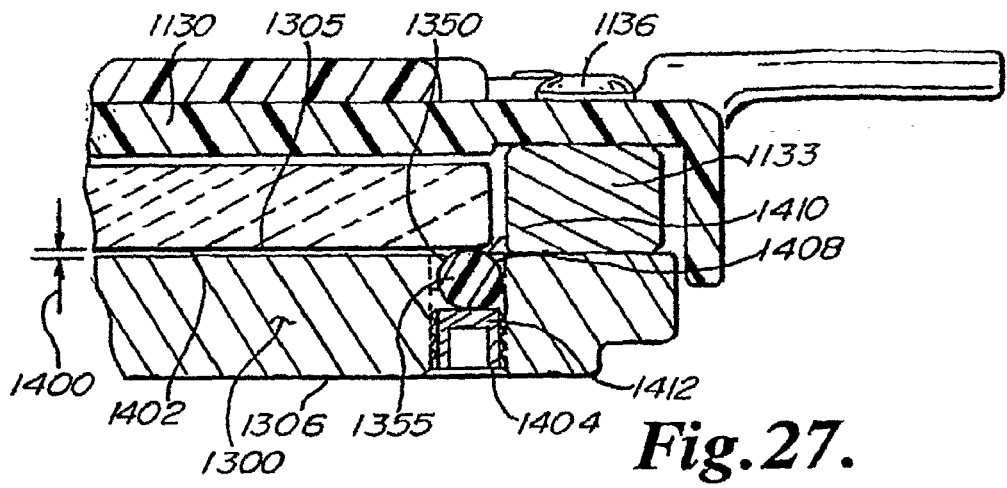
FIG. 27 is an embodiment of a spherical protrusion according to the invention.

Referring to FIG. 27, an embodiment wherein the spherical balls or protrusions 1355 are mounted from the back side (surface 1306) of base plate 1300 is depicted. A cavity 1404 is formed having major access from the back side 1306 of base plate 1300, and defining a spherical apex 1408 that breaks through the major surface 1305. The break through is controlled to form an aperture 1410 that has a predetermined diameter that is smaller than spherical ball 1355. The spherical ball 1355 is seated within aperture 1410, so that a portion protrudes above the major surface 1305 to establish the height 1400 of the gap 1402. The spherical ball 1355 is held in place by a set screw 1412 and the height of the ball extends above the major surface may be minutely adjusted by rotation of the set screw.

Another aspect of the invention is best described by reference to FIGS. 19 through 21. The cover 1130 includes an outer surface 1410 opposite an inner surface 1420 separated from the outer surface 1410 by a thickness 1425. The inner surface 1420 is in communication with the sealed enclosure 1132 whenever the cover 1130 is in engagement with the pod door or base 1120. Cover 1130 may be configured with one or more bores 1430, each passing through the thickness 1425 of the cover 1130. The bores 1430 are disposed spaced apart from each other at precise locations 1440 on the cover inboard of the threaded fasteners 1136 and distally of the outer edge 1139 of the cover 1130.

The illustration of FIGS. 20 and 21 depict a locating pin 1450 dimensioned for a clearance fit within bore 1430 and extending along an actuation axis 1432 that is substantially perpendicular to the outer surface 1410. The locating pin 1450 comprises a shaft portion 1452 having a first end 1460 and a tapered portion 1462 having an opposed second end 1465. The shaft portion 1452 is characterized by a substantially uniform cross-section along its length and extends through the bore 1430 such that first end 1460 remains outside the sealed enclosure 1132 and is proximate outer surface 1410. Tapered portion 1462 is disposed within the sealed enclosure 1132 and is characterized by a sloped surface 1475 that narrows to a radiused apex 1480 at the second end 1465 adjacent the reticle 1110. Tapered portion 1462 may take on one of several three dimensional shapes, such as a cone, frustum or pyramid. Also, tapered portion need not be axisymmetric, and instead may provide a taper only on the surface facing reticle 1110.

In one embodiment, the tapered locating pin 1450 is attached at the first end 1460 to a resilient member 1478 which remains on the outer surface 1410. Resilient member 1478 is configured to bias the tapered locating pin 1450 in a normally refracted position with the second end 1465 located within the sealed enclosure proximate the inner surface 1420 and a deployed position with the second end 1465 located within the sealed enclosure but remote from the inner surface 1420. In an exemplary embodiment, the resilient member 1478 is a disk shaped elastomer which forms a seal between the outer surface 1410 and the clearance between the tapered locating pin 1450 and the bore 1430 to prevent incursion of particulates into the sealed enclosure 1132.

Reticle posts 1310 as well as mask contacts 1350 and tapered portions 1457 of locating pins 1450 may be manufactured from low particulate generating material such as stainless steel or TORLON (discussed above). Reticle posts 1310 and mask contacts 1350 may be press-fit into their respective locations on the base plate 1300.

The FIG. 21 embodiment further depicts an outer package 1500 that abuts the outer surface 1410 of the cover 1130. The outer pod 1500 has a cover 1507 and a door or base 1509. This is the dual pod concept with the inner package that hold the mask and the outer package that holds and secures the inner package. The outer package is used for snipping and the inner pod will be removed and used inside the clean room for the life of the reticle. The outer package 1500 is provided with a structure that includes a plurality of pads 1503, positioned centrally on each side of the reticle seating position and a plurality of pads 1504 positioned to engage the top surface of the inner pod cover 1130. The plurality of pads 1504 are adapted to contact the resilient members 1478 and exert a downward force on the first end 1460 of the tapered locating pins 1450 to cause them to travel downward until the sloping surface 1475 of each locating pin 1450 contacts at least one of first and second upper pair of edges 1270 and 1280 of the reticle 1110 at a contact location 1525. At each contact location 1525 (FIG. 19), the tapered surface 1475 exerts a horizontal bias 1580 in the plane of the second surface 1220 and directed towards the reticle and a vertical bias 1585 directed towards the first surface 1210. The number of locating pins 1450 and the locations of the bores 1430 are preferably selected so that a pair of tapered surfaces 1475 contacts a corresponding upper pair of edges 1270 and 1280 only at diametrically opposed locations providing accurate and secure horizontal positioning, as evidenced by the positions of the resilient members 1478 in FIG. 19.

In operation, the cross-section of tapered portion 1462 of locating pin 1450 tangentially contacts one of the upper pair of edges 1270 and 1280 (FIG. 19), providing minimal contact between the reticle 1110 and locating pin 1450. The resultant of the vertical biases 1585 acts to constrain the movement of the reticle relative to the door. One of skill in the art will readily recognize that other cross-sectional shapes, such as for example, a square, a triangle or a polygon may be advantageously employed together with a bore having a matched cross-section without departing from the scope of the invention.

Figure 28:
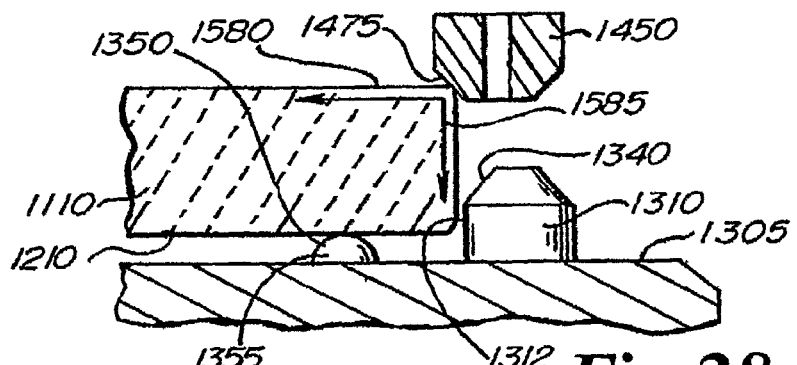
FIG. 28 is an embodiment of a reticle locating pin according to the invention.
Figure 29:
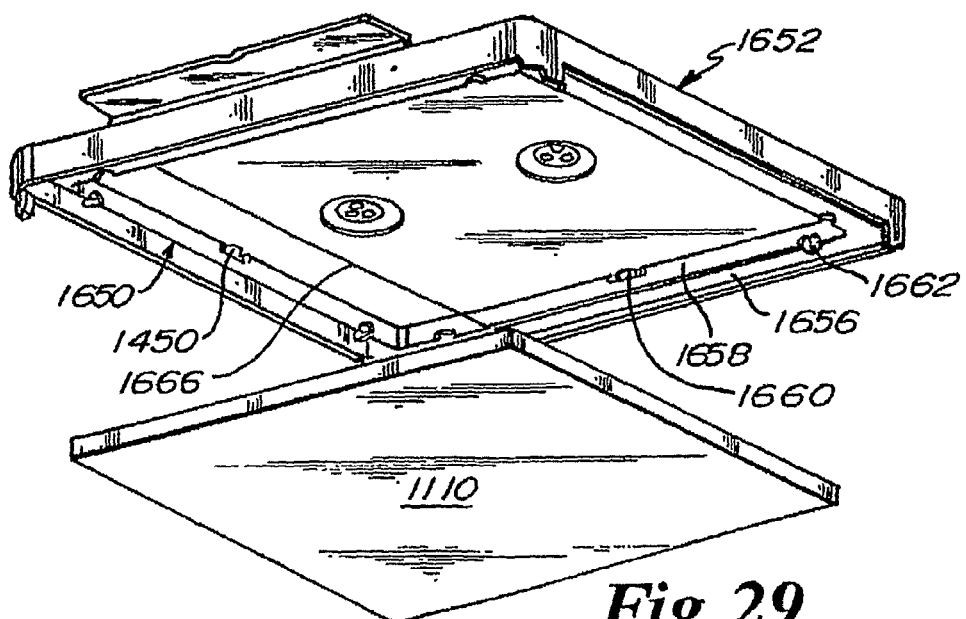
FIG. 29 is a perspective view of a rigid seal ring having a reduced footprint in an embodiment of according to the present invention.
Figure 32:
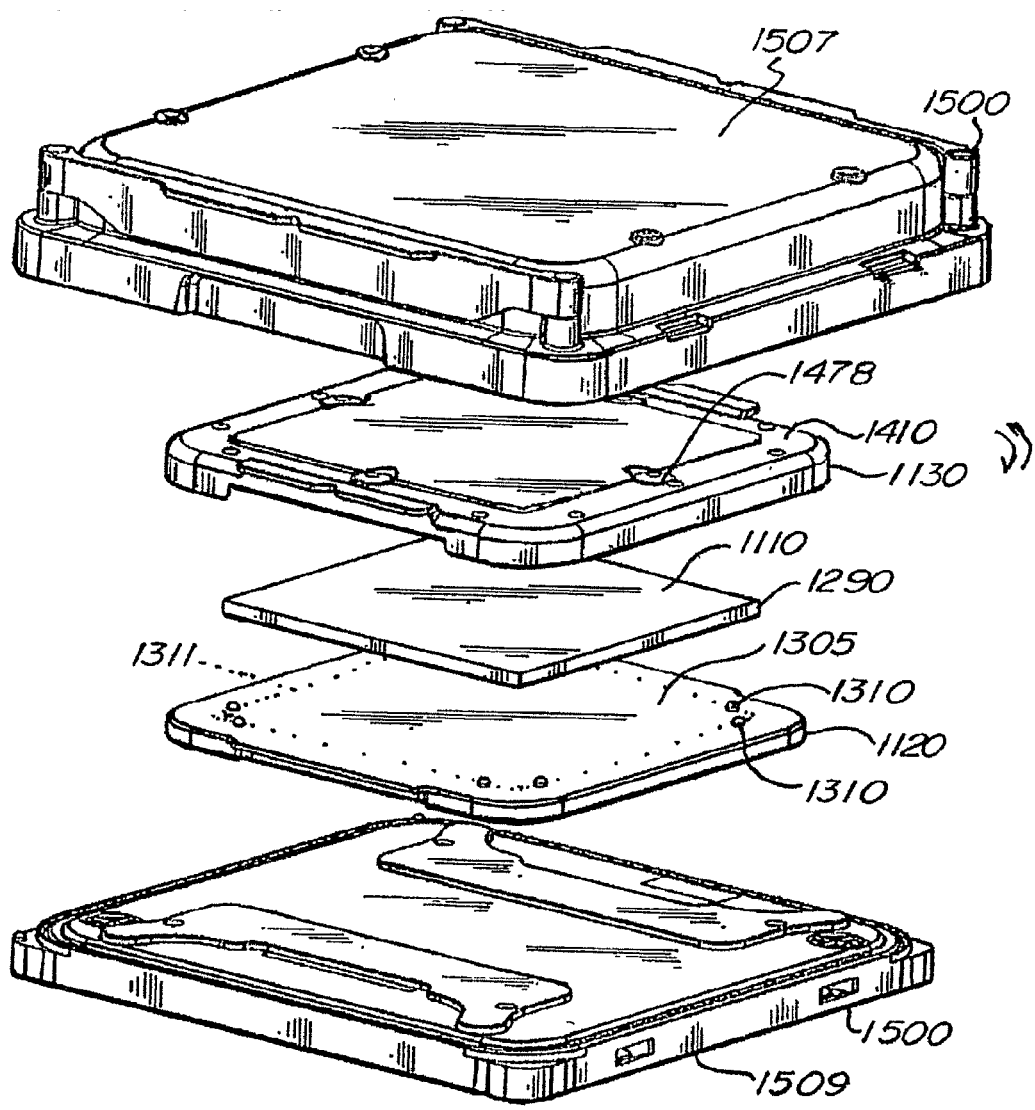
FIG. 32 is an exploded perspective view of a dual containment pod according to the invention.
Figure 33:
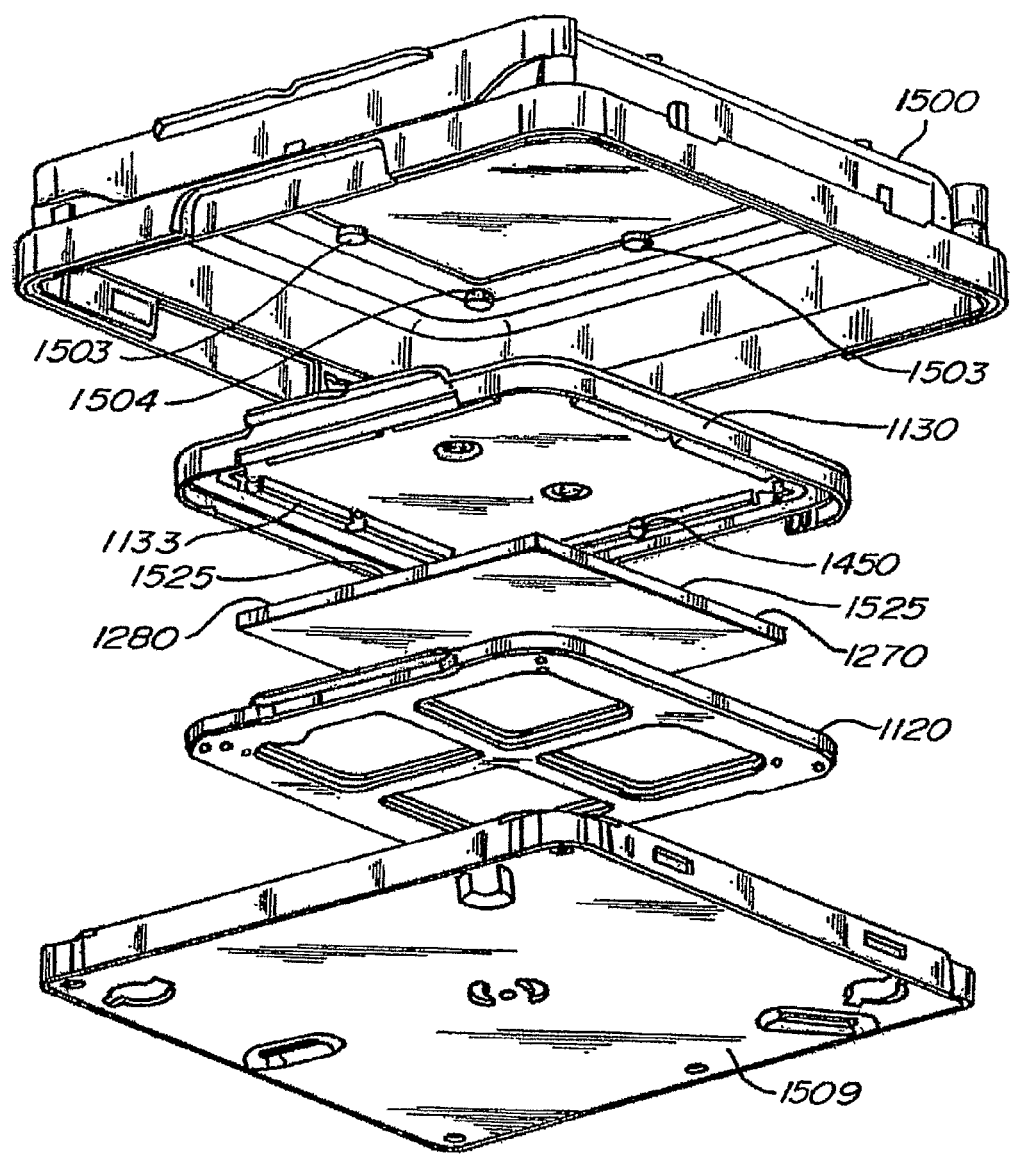
FIG. 33 is an exploded perspective view of the pod of FIG. 32 illustrating the underside of the components.
Figure 34:
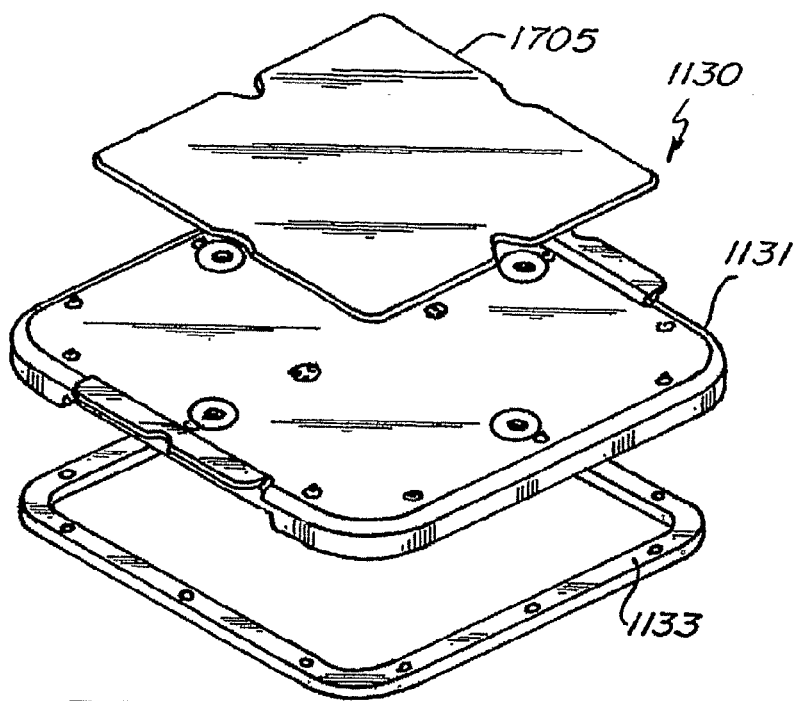
FIG. 34 is an exploded view of the top cover of a reticle pod according to the invention.
Figure 35:
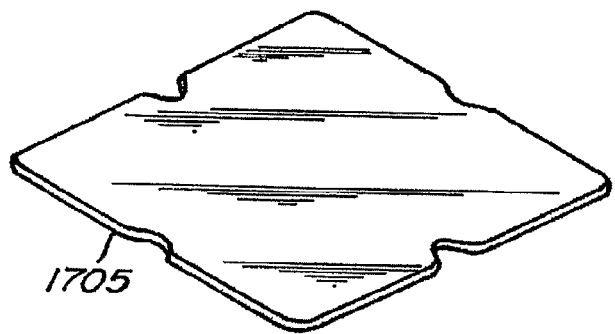
FIG. 35 is a perspective view of a plate forming part of a diffusion filter according to the invention.
Figure 36:
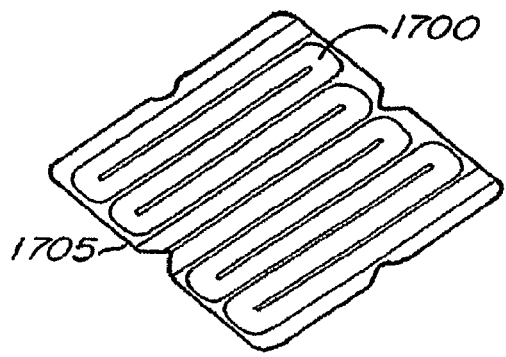
FIG. 36 is a perspective view of a plate forming part of a diffusion filter with a tortuous path inset thereon according to the invention.
Figure 37:
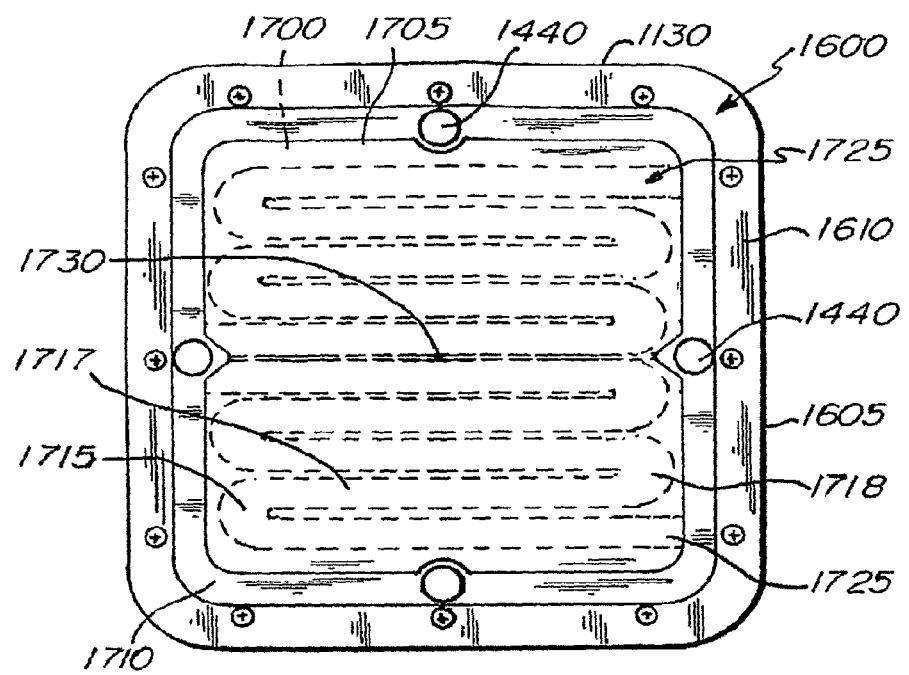
FIG. 37 is a top plan view of the top cover showing a diffusion filter according to the invention.
Figure 38:
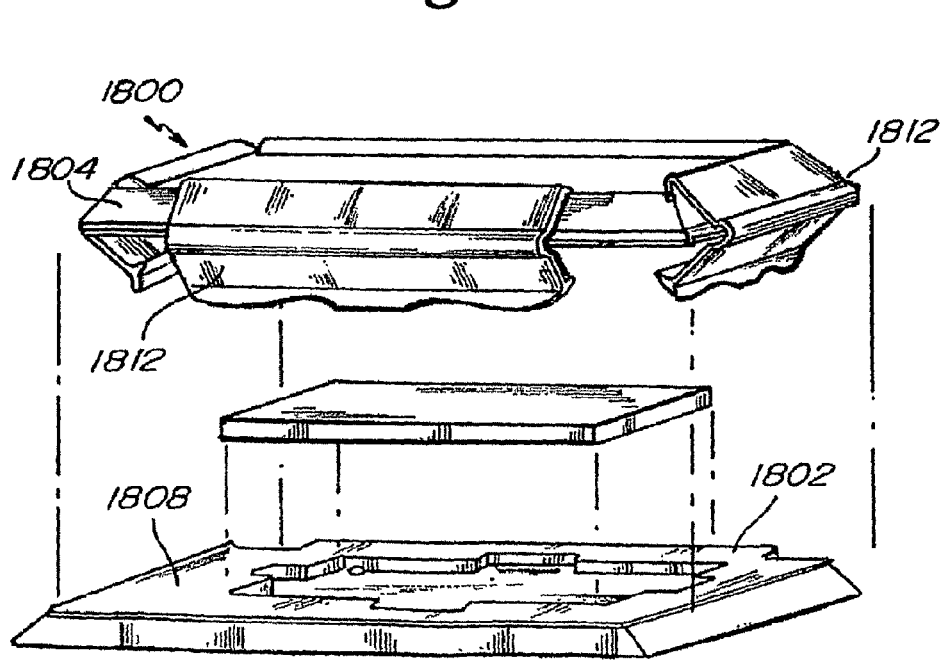
FIG. 38 is a perspective view of an embodiment of the invention.

The embodiments of FIGS. 28, 32 and 33, utilize locating pins 1450 and reticle posts 1310 located just outside the footprint of reticle 1110.

Functionally, the reticle posts 1310 serve only to guide reticle 1110 onto the spherical protrusions 1355 Actuation of locating pins 1450 will center reticle 1110 on the base plate 1300. If reticle 1110 is in contact with one or more reticle posts 1310, the centering operation will translate the reticle 1110 away from reticle posts 1310, leaving a gap 1312 between reticle 1110 and reticle post 1310. In this configuration, tapered surface 1340 be located higher than face patterned face 1210 of reticle 1110.

Referring again to FIGS. 18 through 21, cover 1130 is provided with a seal-ring 1133 disposed on the surface 1420 proximate an outer edge 1605 of the cover 1130. The seal-ring 1133 has a seal contact surface 1610 having a surface finish that may be substantially identical to the surface finish 1320 of the sealing surface 1135. Furthermore, surface 1420 is located so that when the cover 1130 is mated to the door 1120, the seal-contact surface 1610 engages the rigid sealing surface 1135 to create a seal. The two surfaces are kept in contact by adhesion mechanisms that include one or more of capillary, electrostatic, and van der Waals attractive forces and hydrogen bonding, hi a general embodiment of the invention, the entire first major surface 1305 may be provided with a uniform surface finish. Alternatively, the sealing surface 1135 is provided with a first surface finish 1320 and the remaining portion of the first major surface 1305 may be characterized by a second surface finish 1325. The seal-contact surface 1610 and the sealing surface 1135 maybe aluminum with, for example, an electro less nickel finish. Generally, a surface finish with a roughness average (RA) of up to 0.50 micro inches is acceptable with the preferred range being from 0.20-0.40 RA. The surface finish may be obtained through lapping or polishing or other methods known in the art. The seal-ring 1133 maybe a metal band that is laser welded or otherwise adhered or attached to the inside surface of the cover.

A process for assembling the door 1120 includes lapping or polishing the major surface 1305 to a prescribed flatness and finish specification, followed by forming post cavities on the major surface 1305 dimensioned for an interference fit with posts 1310 and forming cavities on the back side 1306 of the base plate 1300 for housing the mask contacts 1350. For the embodiment of FIG. 28, spherical balls 1355 are utilized for the mask contacts 1350. Accordingly, the cavities for housing the mask contacts 1350 are formed to just break the surface 1305 and create the aperture 1410 of a predetermined diameter that permits only a portion of the spherical balls 1355 to extend above the surface 1305 and at the prescribed height 1400. Thereafter, the posts 1310 are press fit into the base plate 1300 and the spherical balls 1355 are secured in place with set screws 1412.

Referring to FIGS. 29 through 36, an embodiment of the invention having a rigid seal ring 1650 of reduced footprint is portrayed. Rigid seal ring 1650 may be mounted to a cover 1652 as previously presented. Cover 1652 may include locating pins 1450 as previously disclosed. Rigid seal ring 1650 includes a mounting face 1654, a sealing face 1656, an inner perimeter face 1658, and a plurality of mounting face recesses 1660 and sealing face recesses 1662. Mounting face recesses 1660 are formed on the mounting face 1654 and the inner perimeter face 1658 and are sized to accommodate locating pins 1450 without contact. Sealing face recesses 1662 are formed on the sealing face 1656 and the inner perimeter 1658 and are sized to accommodate reticle posts 1310 without contact.

Functionally, locating pins 1450 operate within mounting face recesses 1660 and, when cover 1652 is placed over a base 1664, reticle posts 1310 are housed within recesses 1660. The cooperation of components 1450 and 1310 with the recesses 1660 and 1662 enable rigid sealing ring 1650 to have a reduced dimension 1666 while maintaining the integrity of the rigid seal arrangement. The overall plan dimensions of cover 1652 and base 1664 may also be reduced, enabling a more compact overall design.

Referring to FIGS. 34, 35, 36, and 37, another feature of particular embodiment is illustrated. Outer surface 2410 of cover 1130 may be configured with a serpentine rib and a plate 1705 is laser welded over it to form a groove or microchannel 1700, schematically shown in FIG. 37. Micro-Channel 1700 connects the external environment to the internal enclosure 1132 within the container through entry ports 1725 and exit 1730 that lead into the interior of the pod. The groove preferably about from 0.002 to 0.004 inches deep with a repeating pattern of channels segments 1710, 1715, 1717 and 1718 interconnected to each other to present sharp bends to the diffusive flow of a particle through the groove. Each channel is generally about 0.25 to 0.75 inch in width and several inches long. The microchannel provides a diffusion barrier against the migration of particles from the external environment into the internal enclosure but allows equalization of pressure between the inside and outside of the container. The micro channel 1700 may also be formed by creating an appropriately dimensioned channel on the plate 1705 and affixing the plate to the top surface of the upper shell portion 1131 of the top cover 1130 so that it forms the microchannel 1700 to create the diffusion filter or a small gap filter. The filter mechanism is based on the concept that the particles will be attracted to the walls of the channel before entering the carrier and therefore will not make it into the inner sealed environment. This channel also provides pressure equalization between the interior and exterior environment of the EUV pod or container 100. The efficiency of this filter maybe measured using the Frazier Porosity (or Frazier number), cfm/ft2 @ 0.5 in. H20 delta-P of air transmitted through the barrier filter as detailed, for example, in ASTM D737. The container 100 (i.e the EUV pod) will stay in a vacuum environment most of the time. However, it may be moved to an atmospheric clean room environment if the mask needs cleaning or replacement. Under such circumstances a slow acting filter—i.e. one with a low Frazier number is desirable so that the velocity of air across it is very low. Typically, the Frazier number is less than or equal to 0.28 cubic feet per minute @ 0.5" H20 per square foot of filter media.

Referring to FIGS. 38 through 41, an alternate embodiment implementing of the tortuous diffusion filter concept is illustrated. A reticle container 1800 having a base or door 1802 and a cover 1804 cooperate to form an enclosure 1806. A substantially flat and continuous ledge or peripheral portion 1808 is located on the upper face of and near the perimeter of door 1802. The cover 1804 likewise has a flat and continuous ledge or peripheral portion 1810. The respective peripheral portions 1808 and 1810 are dimensioned such that, upon mating cover 1804 with door 1802 and engaging the door latch 1812, the peripheral portion 1808 sealingly abuts with peripheral portion 1810. A tortuous channel 1816 may be formed on the surface either peripheral portion 1808 or 1810.

Figure 39:
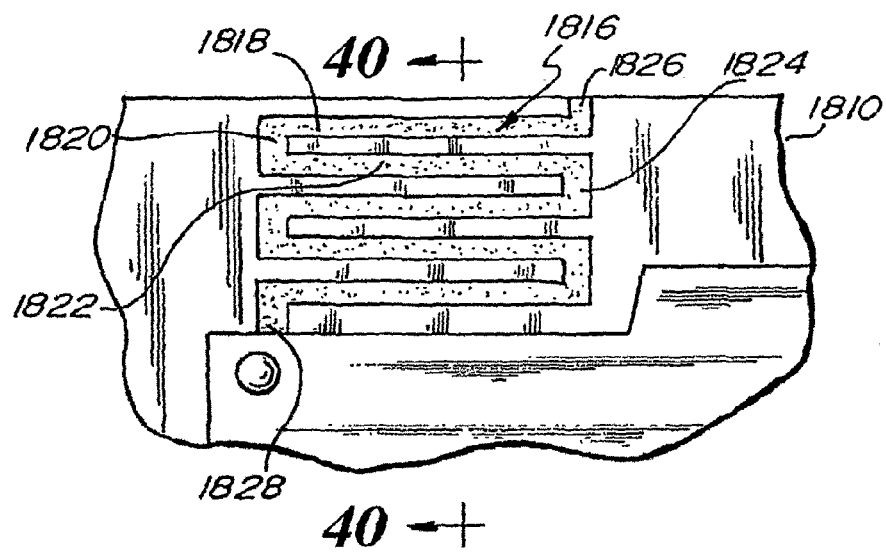
FIG. 39 is a top plan view of a tortuous path diffusion filter on one of the sealing surfaces of a reticle pod according to the invention.
Figure 40:
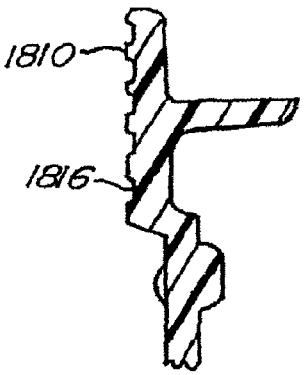
FIG. 40 is a cross section taken at line 40-40 of FIG. 39.

The tortuous path 1816 may take the form of a narrow, serpentine channel that connects the external environment of the container to the interior of the container when the door and cover are engaged. In the embodiment of FIG. 39, the tortuous channel 1816 includes a repeating pattern of segments 1818, 1820, 1822 and 1824 connected in series. Each segment may have a depth into the face of peripheral portion 1808 or 1810 of about 0.002- to 0.004-in. and the shortest segment (i.e. segment 1820) may have a length of about 0.25-in. The total number of segments may be arranged so that a particle entering the channel at 1826 may have to traverse a path of at least 6-in. before entering the container at 1828. The foregoing dimensions are offered as representative and are not to be construed as limiting.

Particles migrating into tortuous channel 1816 tend to hit the walls of the tortuous channel 1816 and collect inside the channel rather than diffusing through the channel into the enclosure 1806. Accordingly, tortuous channel 1816 presents a diffusion barrier or diffusion filter against particle infiltration while providing a means for the pressure inside the enclosure 1806 to equalize with the pressure outside the enclosure.

Figure 41:
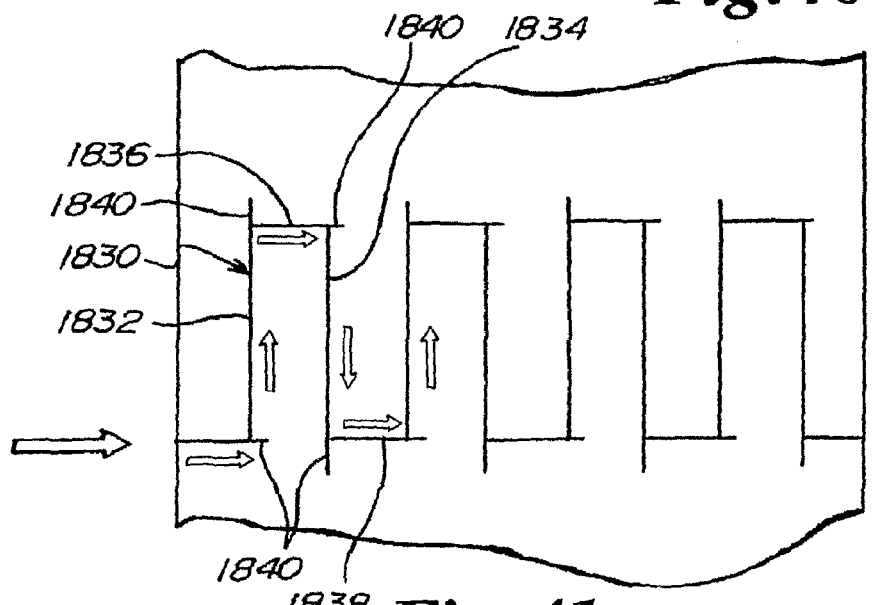
FIG. 41 is a schematic of a tortuous path diffusion filter suitable for the application and according to the invention herein.

Referring to FIG. 41, another embodiment of the tortuous path concept is depicted. A tortuous passage 1830 is characterized by a repeating pattern of major length segments 1832 and 1834 joined by minor length segments 1836 and 1838, interconnected substantially at right angles to each other to present sharp bends to the diffusive flow of a particle passing therethrough. Each of the segments 1832, 1834, 1836 and 1838 extend past the junctions with the respective downstream segment to form a plurality of particle trap segments 1840.

Each particle trap segment 1840 is a "blind alley" that causes any particle flowing into it to drop out of the flow within the segment 1840 rather than navigate the bend into the neighboring segment.

One of skill in the art will readily recognize that other materials, surface treatments and contact areas may be used to obtain the surface adhesion effects and thereby provide a seal without the use of a particle generating elastomeric seal. For example, a comparable seal may be obtained by mating polymers, glass, ceramic and metals to create the seal ring of the invention. It is also understood that specific illustrated features of the reticle pods herein are also advantageous and applicable to wafer carriers and other substrate carriers. For example the diffusion filters would be suitable for wafer containers, polyamide-imide would be very suitable for contact areas of wafers and machine interfaces in wafer containers such as FOUPS and FOSBS (acronyms for front opening unified pod and front opening shipping box respectively).

The container embodiments presented herein or portions thereof may be made from an electrostatically dissipative material, thereby preventing damage to the reticle stored and transported therein.

Because various modifications, substitutions, and changes of this invention may be made by one of skill in the art without departing from the spirit thereof, the invention is not limited to the embodiments illustrated and described herein. Rather, the scope of the invention is to be determined by the appended claims and their equivalents.

The invention claimed is:

1. A container for holding reticles, the reticle having a periphery, a top surface, a bottom surface, a side surface, four peripheral corners, a top edge and a bottom edge, the container comprising:
   an outer container sized to receive an inner container, the outer container comprising an outer cover and a door receivable within the outer cover to define an interior, wherein the inner container comprises
   a base for receiving the reticle, the base having a periphery, and a top upwardly facing horizontal metal surface, the upwardly facing horizontal surface having a planar metal sealing surface extending around the base at or proximate to the periphery of said base, the base further having four pairs of posts and a rounded seating element positioned intermediate each pair of posts, the four pairs of posts and respective rounded seating element positioned therebetween defining a reticle seating position above the top upwardly facing horizontal metal surface; and
   a cover for engaging the top surface of the base plate along the base plate periphery, thereby defining an interior for holding the reticle, the cover having a downwardly facing horizontal planar metal sealing surface for cooperating with the planar metal sealing surface of the base to create a seal therebetween when said respective surfaces are in contact.

2. The container of claim 1 wherein the top surface of the base is continuously planar and integral from the sealing surface to below the reticle.

3. The container of claim 2 wherein the downwardly facing horizontal planar sealing surface has a nickel finish.

4. The container of claim 1 wherein the base is formed primarily of metal.

5. The container of claim 1 wherein the cover comprises a plurality of vertically moveable members positioned in a plurality of apertures in the cover, the members positioned to engage the reticle.

6. The container of claim 5 wherein the each of the moveable reticle members are resiliently positioned in the cover.

7. The container of claim 1 wherein the cover comprises a plurality of vertically moveable members positioned in the cover, the vertically movable members positioned to engage the reticle and are actuatable externally with respect to the cover.

8. The container of claim 1 wherein the top surface of the base and the downwardly facing horizontal planar metal sealing surface of the cover each have a surface finish with a roughness average (RA) of up to 0.50 micro inches.

9. The container of claim 1 wherein the top surface of the base and the downwardly facing horizontal planar metal sealing surface of the cover each have a surface finish with a roughness average (RA) of between 0.20-0.40 micro inches.

10. The container of claim 1 wherein the outer cover includes a plurality of resilient members extending downwardly on an inside surface of said outer cover, and wherein said resilient members engage the top cover of the container.

11. The container of claim 1 wherein the top cover is primarily formed of a polymer and the sealing surface of the top cover is part of a metal ring secured to said polymer.

* * * * *